United States Patent
Chiu et al.

(10) Patent No.: US 11,923,369 B2
(45) Date of Patent: Mar. 5, 2024

(54) INTEGRATED CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Te-Hsin Chiu, Hsinchu (TW); Wei-Cheng Lin, Hsinchu (TW); Wei-An Lai, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/185,464

(22) Filed: Feb. 25, 2021

(65) Prior Publication Data

US 2021/0343744 A1 Nov. 4, 2021

Related U.S. Application Data

(60) Provisional application No. 63/018,132, filed on Apr. 30, 2020.

(51) Int. Cl.
*H01L 27/118* (2006.01)
*H01L 21/768* (2006.01)
(Continued)

(52) U.S. Cl.
CPC .. *H01L 27/11807* (2013.01); *H01L 21/76898* (2013.01); *H01L 27/0207* (2013.01);
(Continued)

(58) Field of Classification Search
CPC ......... H01L 27/11807; H01L 21/76898; H01L 27/0207; H01L 2027/11881; H01L 2027/11887; H03K 3/037; G06F 30/392
See application file for complete search history.

(56) References Cited

U.S. PATENT DOCUMENTS 6,583,045 B1 * 6/2003 Liu ................. H01L 23/535
257/276
7,260,442 B2  8/2007 Hwang et al.
(Continued)

FOREIGN PATENT DOCUMENTS

JP   2017096881  6/2017
KR   20160100176  8/2016
(Continued)

OTHER PUBLICATIONS

Office Action dated Feb. 15, 2022 for corresponding case No. TW 11120144870. (pp. 1-4).
(Continued)

*Primary Examiner* — Mounir S Amer
*Assistant Examiner* — Alexander Belousov
(74) *Attorney, Agent, or Firm* — Hauptman Ham, LLP

(57) ABSTRACT

An integrated circuit includes a set of power rails on a back-side of a substrate, a first flip-flop, a second flip-flop and a third flip-flop. The set of power rails extend in a first direction. The first flip-flop includes a first set of conductive structures extending in the first direction. The second flip-flop abuts the first flip-flop at a first boundary, and includes a second set of conductive structures extending in the first direction. The third flip-flop abuts the second flip-flop at a second boundary, and includes a third set of conductive structures extending in the first direction. The first, second and third flip-flop are on a first metal layer and are on a front-side of the substrate opposite from the back-side. The second set of conductive structures are offset from the first boundary and the second boundary in a second direction.

20 Claims, 24 Drawing Sheets

(51) Int. Cl.
  *H01L 27/02*     (2006.01)
  *H03K 3/037*     (2006.01)
  *G06F 30/392*    (2020.01)

(52) U.S. Cl.
  CPC .......... *H03K 3/037* (2013.01); *G06F 30/392* (2020.01); *H01L 2027/11881* (2013.01); *H01L 2027/11887* (2013.01)

(56) References Cited

U.S. PATENT DOCUMENTS

| | | | |
|---|---|---|---|
| 9,256,709 B2 | 2/2016 | Yu et al. | |
| 2014/0040838 A1 | 2/2014 | Liu et al. | |
| 2015/0278429 A1 | 10/2015 | Chang | |
| 2017/0077910 A1 | 3/2017 | Kim et al. | |
| 2017/0292993 A1* | 10/2017 | Yoon | G01R 31/31725 |
| 2020/0105671 A1 | 4/2020 | Lai et al. | |
| 2020/0266169 A1* | 8/2020 | Kang | H01L 21/76877 |

FOREIGN PATENT DOCUMENTS

| | | |
|---|---|---|
| KR | 20170115420 | 10/2017 |
| KR | 20180129673 | 12/2018 |
| KR | 20190087752 | 7/2019 |
| KR | 20200008514 | 1/2020 |
| KR | 20200019833 | 2/2020 |

OTHER PUBLICATIONS

Notice of Allowance dated Mar. 31, 2022 for corresponding case No. KR 10-2021-0053951. (pp. 1-3) English translation attached on p. 1.

Office Action dated Jul. 27, 2023 for corresponding case No. CN 202110481319.0. (pp. 1-6).

Office Action dated Jul. 17, 2023 for corresponding case No. DE 10 2021 105 465.6. (pp. 1-6).

\* cited by examiner

INTEGRATED CIRCUIT, SYSTEM AND METHOD OF FORMING THE SAME

PRIORITY CLAIM

This application claims the benefit of U.S. Provisional Application No. 63/018,132, filed Apr. 30, 2020, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
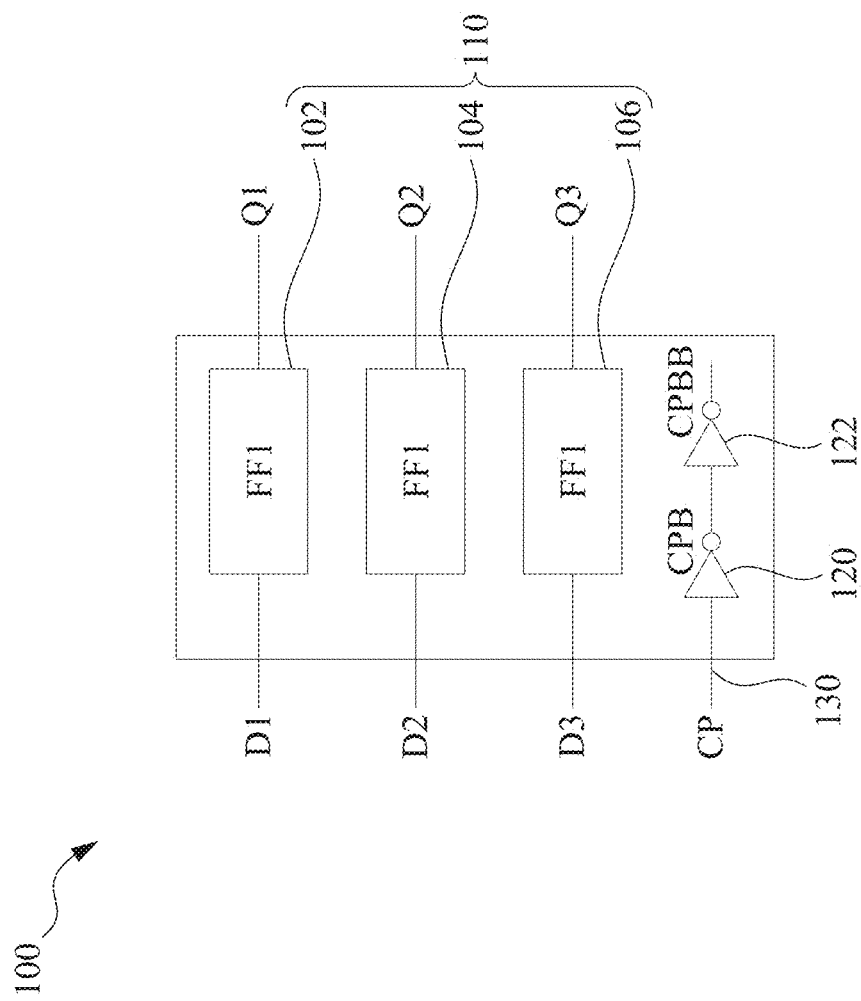
FIG. 1 is a schematic diagram of a multi-bit flip-flop (MBFF), in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a set of power rails extending in a first direction. In some embodiments, the IC further includes a first flip-flop including a first set of conductive structures extending in the first direction. In some embodiments, the IC further includes a second flip-flop abutting the first flip-flop at a first boundary. In some embodiments, the second flip-flop includes a second set of conductive structures extending in the first direction. In some embodiments, the IC further includes a third flip-flop abutting the second flip-flop at a second boundary. In some embodiments, the third flip-flop includes a third set of conductive structures extending in the first direction.

In some embodiments, the set of power rails are on a back-side of a substrate. In some embodiments, the first flip-flop, the second flip-flop and the third flip-flop are on a front-side of the substrate opposite from the back-side.

In some embodiments, the second set of conductive structures are offset from the first boundary and the second boundary in the second direction. In some embodiments, by positioning the second set of conductive structures to be offset from the second boundary, causes the second set of conductive structures to be shifted in the second direction from the second boundary and the third set of conductive structures, thereby increasing the distance between the second set of conductive structures and the third set of conductive structures. In some embodiments, increasing the distance between the second set of conductive structures and the third set of conductive structures results in less coupling capacitance between the second set of conductive structures and the third set of conductive structures compared to other approaches. In some embodiments, reducing the coupling capacitance between the second set of conductive structures and the third set of conductive structures results in integrated circuit consuming less power than other approaches.

FIG. 1 is a schematic diagram of a multi-bit flip-flop (MBFF) 100, in accordance with some embodiments.

MBFF 100 comprises a flip-flop 102, a flip-flop 104, a flip-flop 106, an inverter 120, an inverter 122 and a clock input pin 130. MBFF 100 is a three bit flip-flop. In other words, MBFF includes three flip-flops (e.g., flip-flops 102, 104 and 106). Other numbers of bits or corresponding flip-flops in MBFF 100 are within the scope of the present disclosure. In some embodiments, MBFF 100 is part of an integrated circuit (not shown) that includes other MBFF's, similar to MBFF 100, or one or more other flip-flops.

MBFF 100 is configured to receive input signals D1, D2 and D3, and to receive clock signal CP on the clock input pin 130. MBFF 100 is configured to generate output signals Q1, Q2 and Q3.

Flip-flops 102, 104 and 106 are configured to receive corresponding input signals D1, D2 and D3 on corresponding input terminals (not labelled). Flip-flops 102, 104 and 106 are configured to generate corresponding output signals Q1, Q2 and Q3, and to output the corresponding output signals Q1, Q2 and Q3 on corresponding output terminals (not labelled).

Each of flip-flops 102, 104 and 106 is further configured (not shown) to receive clock signal CP and clock signal CPB. Each of flip-flops 102, 104 and 106 is coupled to inverters 120 and 122. In some embodiments, each of flip-flops 102, 104 and 106 is configured (not shown) to share input pin 130. Each of flip-flops 102, 104 and 106 is further configured to receive clock signal CP from input pin 130, and is configured to receive clock signal CPB from inverter 120. In some embodiments, each of flip-flops 102, 104 and 106 are configured to receive clock signal CPBB from inverter 122. In some embodiments, clock signal CPBB is a buffered version of clock signal CP. In some embodiments, clock signal CPB is inverted from the clock signal CP.

In some embodiments, one or more of flip-flops 102, 104 and 106 are edge triggered flip-flops. In some embodiments, one or more of flip-flops 102, 104 and 106 includes a DQ flip-flop, an SR-flip-flop, a T flip-flop, a JK flip-flop, or the like. Other types of flip-flops or configurations for at least flip-flop 102, 104, 106 or 108 are within the scope of the present disclosure.

An input terminal of inverter 120 is coupled to the clock input pin 130, and is configured to receive clock signal CP. An output terminal of inverter 120 is coupled to an input terminal of inverter 122 and is configured to output clock signal CPB.

An input terminal of inverter 122 is configured to receive clock signal CPB. An output terminal of inverter 120 is configured to output clock signal CPBB. Other configurations for at least inverter 120 or 122 are within the scope of the present disclosure.

Flip-flop 102, flip-flop 104 and flip-flop 106 (collectively referred to as "a set of flip-flops 110") are each configured to have a same driving current capability. In some embodiments, the driving current capability corresponds to the driving current conducted by at least flip-flop 102, flip-flop 104 or flip-flop 106. In some embodiments, at least flip-flop 102, flip-flop 104 or flip-flop 106 is configured to have a driving current capability different from the driving current capability of at least flip-flop 102, flip-flop 104 or flip-flop 106. For example, in some embodiments, MBFF 100 is configured as a mixed driving multi-bit flip-flop. In some embodiments, MBFF 100 includes flip-flops configured with at least two different driving current capabilities. In some embodiments, each of the flip-flops contained in MBFF 100 are configured to have different driving current capability. Other numbers of different driving current capabilities for MBFF 100 are within the scope of the present disclosure. For example, in some embodiments, MBFF 100 includes three different flip-flops, each of the three different flip-flops is configured with a different driving current capability from the other.

In some embodiments, the driving current capability of at least flip-flop 102, flip-flop 104 or flip-flop 106 is based on a number of fins in one or more transistors in flip-flop 102, flip-flop 104 or flip-flop 106. In some embodiments, the number of fins and the driving current capability have a direct relationship. For example, in some embodiments, as the number of fins in one or more transistors in flip-flop 102, flip-flop 104 or flip-flop 106 is increased, the corresponding driving current capability is also increased, and vice versa.

In some embodiments, by configuring MBFF 100 as a multi-bit flip-flop, a number of duplicate inverters in the clock path of MBFF 100 are reduced resulting in MBFF 100 having less input pins for a corresponding clock signal, resulting in MBFF 100 having a lower total clock dynamic power consumption and occupying less area compared with other approaches. In some embodiments, by configuring MBFF 100 as a multi-bit flip-flop, the power consumption of each flip-flop in MBFF 100 is optimized compared with other approaches.

Figure 2:
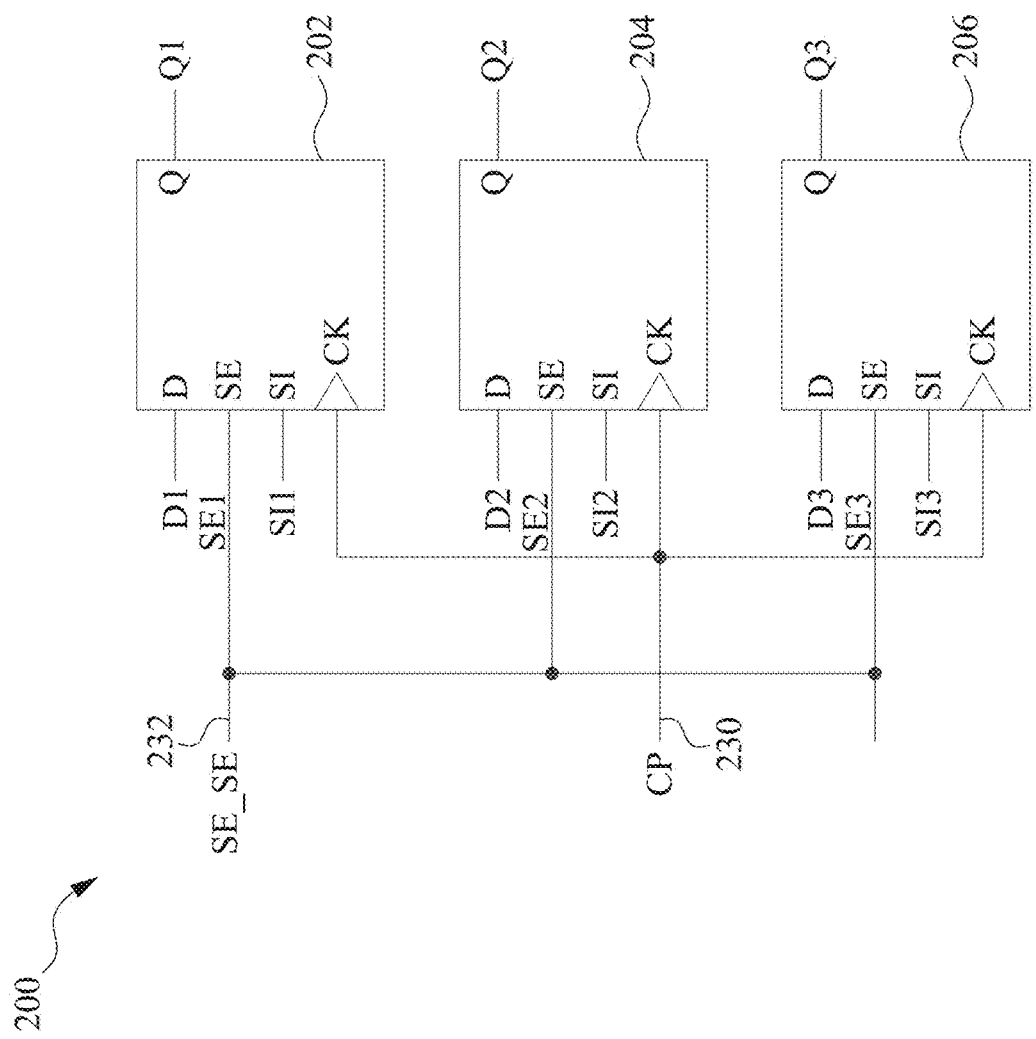
FIG. 2 is a circuit diagram of a circuit, in accordance with some embodiments.

FIG. 2 is a circuit diagram of a circuit 200, in accordance with some embodiments.

Circuit 200 is an embodiment of MBFF 100 of FIG. 1, and similar detailed description is therefore omitted. In some embodiments, circuit 200 is an MBFF circuit. In some embodiments, circuit 200 is part of an integrated circuit including components other than those shown in FIG. 2.

Components that are the same or similar to those in each of FIGS. 2-12 are given the same reference numbers, and detailed description thereof is thus omitted.

Circuit 200 comprises a flip-flop 202, a flip-flop 204, a flip-flop 206, a clock input pin 230, and a scan enable pin 232.

Flip-flops 202, 204 and 206 are embodiments of corresponding flip-flops 102, 104 and 106 of FIG. 1, and similar detailed description is omitted. Clock input pin 230 is an embodiment of clock input pin 130 of FIG. 1, and similar detailed description is omitted.

Circuit 200 is a three bit flip-flop, and each bit is associated with a corresponding flip-flop (e.g., flip-flops 202, 204 and 206). In other words, circuit 200 includes three flip-flops (e.g., flip-flops 202, 204 and 206). Other numbers of bits or numbers of corresponding flip-flops in circuit 200 are within the scope of the present disclosure. In some embodiments, circuit 200 is part of an integrated circuit (not shown) that includes other MBFFs, similar to MBFF 100, or one or more other flip-flops.

Each of flip-flops 202, 204 and 206 are a DQ flip-flop. In some embodiments, one or more of flip-flops 202, 204 or 206 includes an SR-flip-flop, a T flip-flop, a JK flip-flop, or the like. Other types of flip-flops or configurations for at least flip-flop 202, 204 or 206 are within the scope of the present disclosure.

Each of flip-flops 202, 204 and 206 has a corresponding clock input terminal CK configured to receive clock signal CP. In some embodiments, each of flip-flops 202, 204 and 206 is configured to share the clock input pin 230. In some embodiments, the clock input terminals of flip-flops 202, 204 and 206 are coupled together, and configured to receive the clock signal CP from the clock input pin 230.

Each of flip-flops 202, 204 and 206 has a corresponding scan enable terminal SE configured to receive corresponding scan enable signals SE1, SE2 and SE3. In some embodiments, each of flip-flops 202, 204 and 206 is configured to share the scan enable pin 232. In some embodiments, the scan enable terminals of flip-flops 202, 204 and 206 are coupled together, and configured to receive the scan enable signal SE_SE from the scan enable pin 232. In these embodiments, scan enable signal SE_SE is equal to each of scan enable signals SE1, SE2 and SE3.

Each of flip-flops 202, 204 and 206 has a corresponding data terminal D configured to receive corresponding data signal D1, D2 and D3. Each of flip-flops 202, 204 and 206 has a corresponding scan in terminal SI configured to receive corresponding scan in signal SI1, SI2 and SI3. Each of flip-flops 202, 204 and 206 has a corresponding output terminal Q configured to output corresponding output signal Q1, Q2 and Q3.

In some embodiments, each of flip-flops 202, 204 and 206 has a corresponding multiplexer (not shown in FIG. 2, but shown in FIGS. 3A-3B) configured to multiplex one or more of scan enable signal SE_SE, scan in signal SI1, SI2 or SI3, or data signal D1, D2 or D3.

Figure 3A:
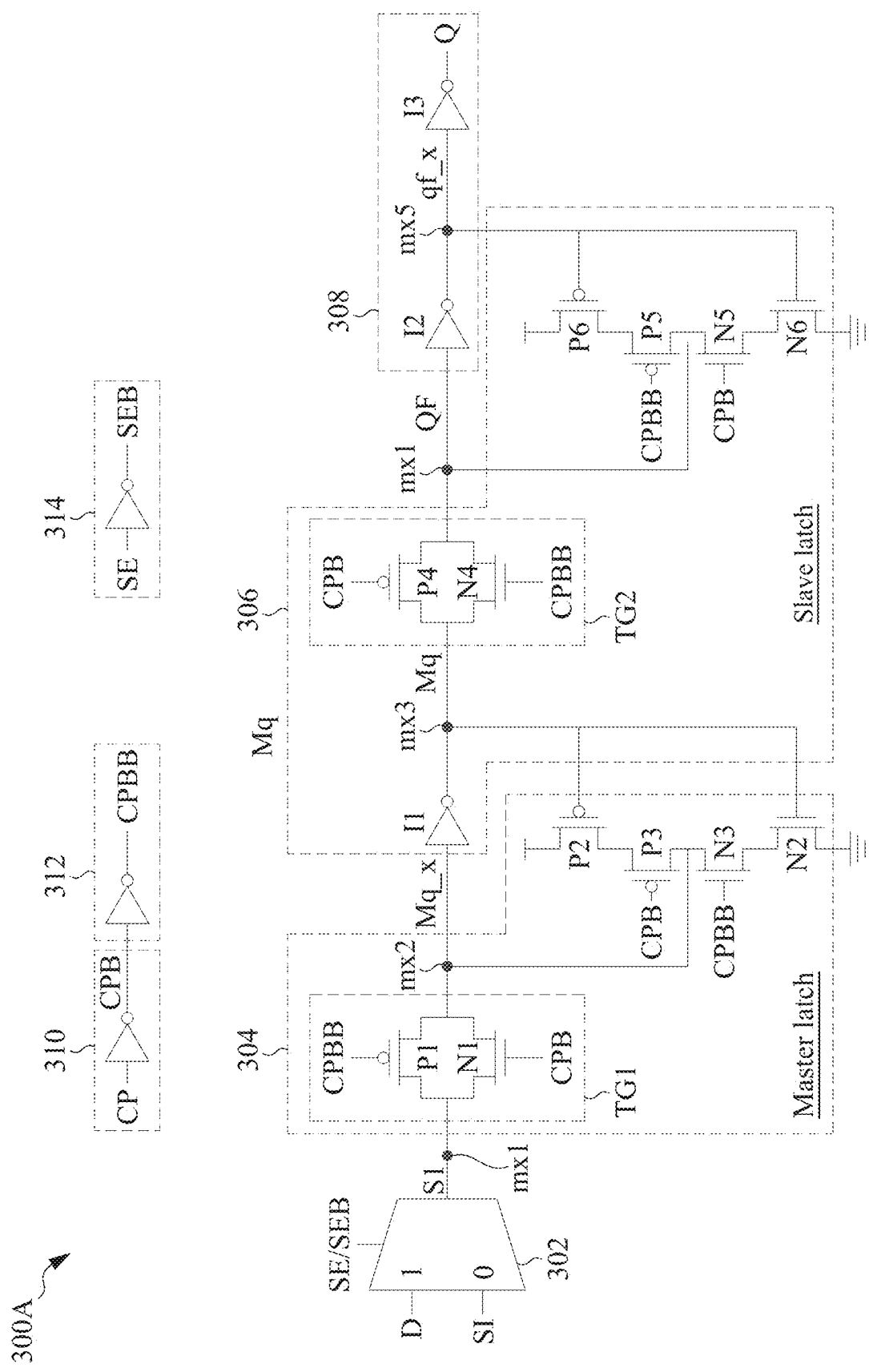
FIG. 3A is a circuit diagram of an integrated circuit, in accordance with some embodiments.

FIG. 3A is a circuit diagram of an integrated circuit 300A, in accordance with some embodiments.

Integrated circuit 300A is an embodiment of one or more of flip-flop 102, 104 or 106 of FIG. 1 or one or more of flip-flop 202, 204 or 206 of FIG. 2, and similar detailed description is therefore omitted.

Integrated circuit 300A is a flip-flop circuit. Integrated circuit 300A is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 300A includes a multiplexer 302, a latch 304, a latch 306, an output circuit 308, an inverter 310, an inverter 312 and an inverter 314.

Multiplexer 302 includes a first input terminal configured to receive the data signal D, a second input terminal configured to receive the scan in signal SI, and a third input terminal configured to receive a scan enable signal SE or an inverted scan enable signal SEB. In some embodiments, the scan enable signal SE is a selection signal of multiplexer 302, and an inverted scan enable signal SEB is an inverted selection signal of multiplexer 302. An output terminal of multiplexer 302 is coupled to an input terminal of latch 304 at node mx1. Multiplexer 302 is configured to output a multiplexed signal S1 to latch 304. In some embodiments, the multiplexed signal S1 corresponds to the data signal D or the scan in signal SI responsive to the scan enable signal SE or the inverted scan enable signal SEB. In some embodiments, the third input terminal of multiplexer 304 is coupled to inverter 314 to receive at least scan enable signal SE or inverted scan enable signal SEB.

Latch 304 is coupled to multiplexer 302 and latch 306. The input terminal of latch 304 is configured to receive the multiplexed signal S1 from multiplexer 302. An output terminal of latch 304 is coupled to an input terminal of latch 306 at a node mx2. Latch 304 is configured to output a signal Mq_x to latch 306 by the output terminal. In some embodiments, signal Mq_x is a latched version of signal S1. In some embodiments, latch 304 is coupled to inverter 310, and is configured to receive clock signal CPB. In some embodiments, latch 304 is coupled to inverter 312, and is configured to receive clock signal CPBB.

Latch 306 is coupled to latch 304 and output circuit 308. The input terminal of latch 306 is configured to receive signal Mq_x from latch 304. An output terminal of latch 306 is coupled to an input terminal of output circuit 308 at a node mx4. Latch 306 is configured to output a signal QF to output circuit 308 by the output terminal. In some embodiments, signal QF is a latched version of signal S1 or Mq_x. In some embodiments, latch 306 is coupled to inverter 310, and is configured to receive clock signal CPB. In some embodiments, latch 306 is coupled to inverter 312, and is configured to receive clock signal CPBB.

Output circuit 308 is coupled to latch 306. The input terminal of output circuit 308 is configured to receive signal QF from latch 306. An output terminal of output circuit 308 is configured to output the output signal Q. In some embodiments, signal QF is a latched version of signal S1 or Mq_x.

Latch 304 includes a transmission gate TG1, NMOS transistors N2 and N3 and PMOS transistors P2 and P3.

Transmission gate TG1 is coupled between node mx1 and node mx2. Transmission gate TG1 is configured to receive signal S1, clock signal CPB and clock signal CPBB. Transmission gate TG1 is configured to output signal Mq_x to inverter I1, PMOS transistor P3 and NMOS transistor N3. Transmission gate TG1 includes an NMOS transistor N1 and a PMOS transistor P1 that are coupled together.

A gate terminal of PMOS transistor P1 is configured to receive clock signal CPBB. A gate terminal of NMOS transistor N1 is configured to receive clock signal CPB.

Each of a source terminal of PMOS transistor P1, a source terminal of NMOS transistor N1, node mx1 and the output terminal of multiplexer 302 are coupled together. In some embodiments, a drain terminal of PMOS transistor P1 and a drain terminal of NMOS transistor N1 are coupled to node mx1 and the output terminal of multiplexer 302.

Each of the drain terminal of PMOS transistor P1, the drain terminal of NMOS transistor N1, node mx2, a drain terminal of NMOS transistor N3 and a drain terminal of PMOS transistor P3 are coupled together. In some embodiments, the source terminal of PMOS transistor P1 and the source terminal of NMOS transistor N1 are coupled to node mx2, the drain terminal of NMOS transistor N3 and the drain terminal of PMOS transistor P3.

A gate terminal of PMOS transistor P2 and a gate terminal of NMOS transistor N2 are coupled together, and are further coupled to at least node mx3.

A source terminal of PMOS transistor P2 is coupled to the voltage supply VDD. A drain terminal of PMOS transistor P2 is coupled to a source terminal of PMOS transistor P3.

A gate terminal of PMOS transistor P3 is configured to receive clock signal CPB. In some embodiments, the gate terminal of PMOS transistor P3 is coupled to at least an output terminal of inverter 310. Each of a drain terminal of PMOS transistor P3 and a drain terminal of NMOS transistor N3 are coupled to each other, and are further coupled to at least node mx2.

A gate terminal of NMOS transistor N3 is configured to receive clock signal CPBB. In some embodiments, the gate terminal of NMOS transistor N3 is coupled to at least an output terminal of inverter 312.

A source terminal of NMOS transistor N3 is coupled to a drain terminal of NMOS transistor N2. A source terminal of transistor N2 is coupled to the reference voltage supply VSS.

Latch 306 includes an inverter I1, a transmission gate TG2, NMOS transistors N5 and N6 and PMOS transistors P5 and P6.

An input terminal of inverter I1 is coupled to at least node mx2 and transmission gate TG1, and is configured to receive signal Mq_x. An output terminal of inverter I1 is coupled to at least node mx3, and is configured to output a signal Mq to the gate of PMOS transistor P2, the gate of NMOS transistors N2 and transmission gate TG2.

Transmission gate TG2 is coupled between node mx3 and node mx4. Transmission gate TG2 is configured to receive the signal Mq, clock signal CPB and clock signal CPBB. Transmission gate TG2 is configured to output signal QF to inverter 12, PMOS transistor P5 and NMOS transistor N5. Transmission gate TG2 includes an NMOS transistor N4 and a PMOS transistor P4 that are coupled together.

A gate terminal of PMOS transistor P4 is configured to receive clock signal CPB. A gate terminal of NMOS transistor N4 is configured to receive clock signal CPBB.

Each of a source terminal of PMOS transistor P4, a source terminal of NMOS transistor N4, node mx3, the output terminal of inverter I1, the gate terminal of PMOS transistor P2 and the gate terminal of NMOS transistor N2 are coupled together. In some embodiments, a drain terminal of PMOS transistor P4 and a drain terminal of NMOS transistor N4 are coupled to node mx3, the output terminal of inverter I1, the gate terminal of PMOS transistor P2 and the gate terminal of NMOS transistor N2.

Each of the drain terminal of PMOS transistor P4, the drain terminal of NMOS transistor N4, node mx4, an input terminal of inverter 12, a drain terminal of NMOS transistor N5 and a drain terminal of PMOS transistor P5 are coupled together. In some embodiments, the source terminal of PMOS transistor P4 and the source terminal of NMOS transistor N4 are coupled to node mx4, an input terminal of inverter 12, a drain terminal of NMOS transistor N5 and a drain terminal of PMOS transistor P5.

A gate terminal of PMOS transistor P6 and a gate terminal of NMOS transistor N6 are coupled together, and are further coupled to at least node mx5.

A source terminal of PMOS transistor P6 is coupled to the voltage supply VDD. A drain terminal of PMOS transistor P6 is coupled to a source terminal of PMOS transistor P5.

A gate terminal of PMOS transistor P5 is configured to receive clock signal CPBB. In some embodiments, the gate terminal of PMOS transistor P5 is coupled to at least an output terminal of inverter 312. Each of a drain terminal of PMOS transistor P5 and a drain terminal of NMOS transistor N5 are coupled to each other, and are further coupled to at least node mx4.

A gate terminal of NMOS transistor N5 is configured to receive clock signal CPB. In some embodiments, the gate terminal of NMOS transistor N5 is coupled to at least an output terminal of inverter 310.

A source terminal of NMOS transistor N5 is coupled to a drain terminal of NMOS transistor N6. A source terminal of transistor N6 is coupled to the reference voltage supply VSS. Output circuit 308 includes an inverter 12 coupled to an inverter 13.

An input terminal of inverter 12 is coupled to at least node mx4, and is configured to receive signal QF. An output terminal of inverter 12 is coupled to and configured to output a signal QF_x to at least an input terminal of inverter 13, the gate of PMOS transistor P6, the gate of NMOS transistor N6 or node mx5.

An input terminal of inverter 13 is coupled to at least node mx5, and is configured to receive the signal QF_x from inverter 12. An output terminal of inverter 13 is configured to output the output signal Q.

An input terminal of inverter 310 is configured to receive clock signal CP. An output terminal of inverter 310 is configured to output the clock signal CPB to at least an input terminal of inverter 312. In some embodiments, the output terminal of inverter 310 is coupled to at least the gate terminal of PMOS transistor P3, the gate terminal of NMOS transistor N5, the gate terminal of PMOS transistor P4 or the gate terminal of NMOS transistor N1.

An input terminal of inverter 312 is coupled to at least the output terminal of inverter 310, and is configured to receive clock signal CPB. An output terminal of inverter 312 is configured to output the clock signal CPBB. In some embodiments, the output terminal of inverter 312 is coupled to and outputs the clock signal CPBB to at least the gate terminal of PMOS transistor P5, the gate terminal of NMOS transistor N3, the gate terminal of PMOS transistor P1 or the gate terminal of NMOS transistor N4.

An input terminal of inverter 314 is configured to receive the scan enable signal SE. In some embodiments, the input terminal of inverter 314 is coupled to the third input terminal of multiplexer 302. An output terminal of inverter 314 is configured to output the inverted scan enable signal SEB. In some embodiments, the output terminal of inverter 314 is coupled to the third input terminal of multiplexer 302.

Figure 3B:
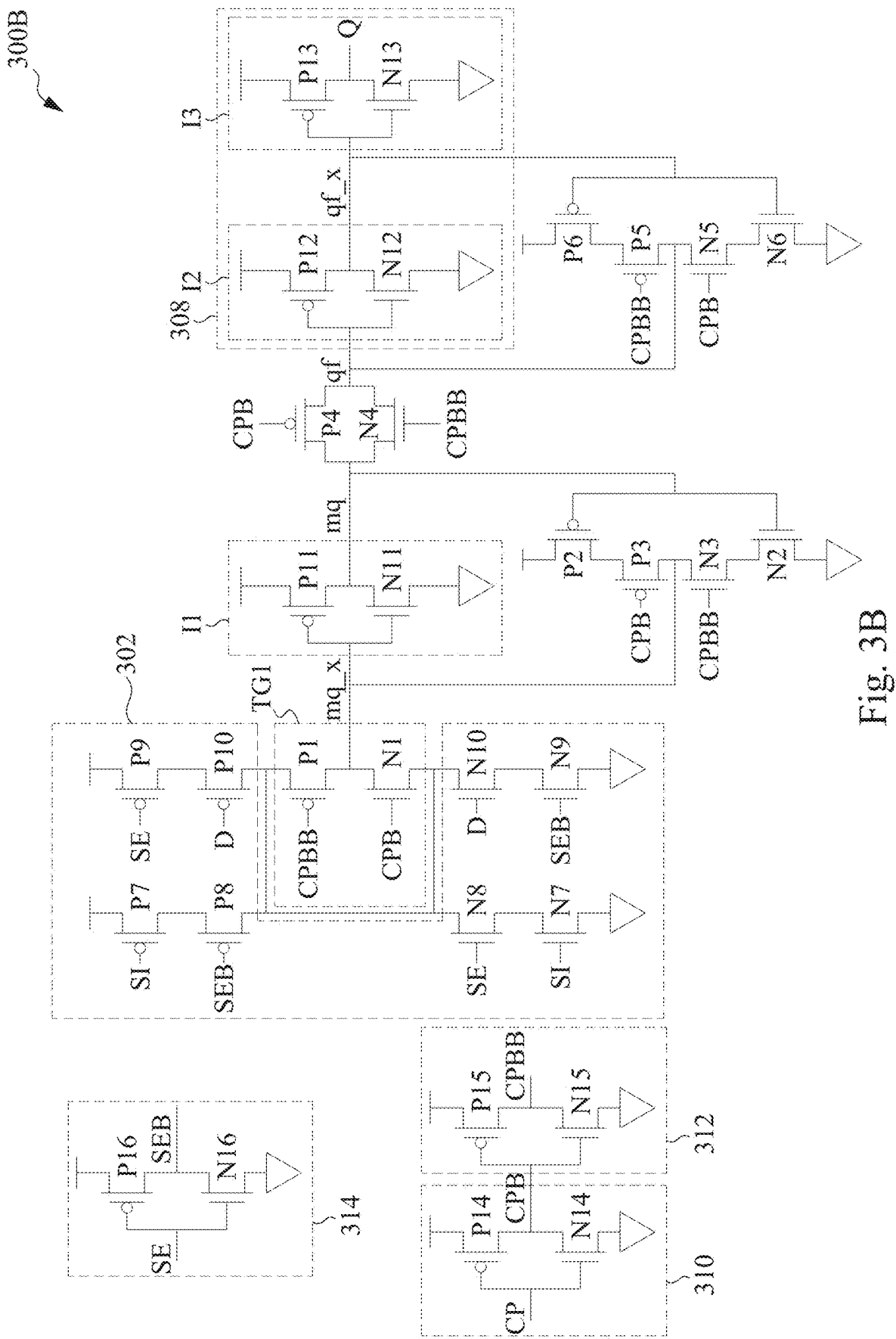
FIG. 3B is a circuit diagram of an integrated circuit, in accordance with some embodiments.

FIG. 3B is a circuit diagram of an integrated circuit 300B, in accordance with some embodiments.

Integrated circuit 300B is an embodiment of integrated circuit 300A, and similar detailed description is therefore omitted. Integrated circuit 300B is an embodiment of one or more of flip-flop 102, 104 or 106 of FIG. 1 or one or more of flip-flop 202, 204 or 206 of FIG. 2, and similar detailed description is therefore omitted.

Integrated circuit 300B includes multiplexer 302, latch 304 (not labelled in FIG. 3B), latch 306 (not labelled in FIG. 3B), output circuit 308, inverter 310, inverter 312 and inverter 314.

Multiplexer 302 includes NMOS transistors N7, N8, N9 and N10, and PMOS transistors P7, P8, P9 and P10.

A gate terminal of PMOS transistor P7 is configured to receive scan in signal SI. A gate terminal of NMOS transistor N7 is configured to receive scan in signal SI. In some embodiments, the gate terminal of PMOS transistor P7 is coupled to the gate terminal of NMOS transistor N7. In some embodiments, the gate terminals of PMOS transistor P7 and NMOS transistor N7 correspond to the second input terminal of multiplexer 302 in FIG. 3A. A source terminal of PMOS transistor P7 is coupled to the voltage supply VDD. A drain terminal of PMOS transistor P7 is coupled to a source terminal of PMOS transistor P8.

A gate terminal of PMOS transistor P8 is configured to receive inverted scan enable signal SEB. Each of a drain terminal of PMOS transistor P8, a drain terminal of PMOS transistor P10, a drain terminal of NMOS transistor N8, a drain terminal of NMOS transistor N10, the drain terminal or source terminal of PMOS transistor P1, and the drain terminal or source terminal of NMOS transistor N1 are coupled together.

A gate terminal of PMOS transistor P9 is configured to receive scan enable signal SE. A source terminal of PMOS transistor P9 is coupled to the voltage supply VDD. A drain terminal of PMOS transistor P9 is coupled to a source terminal of PMOS transistor P10.

A gate terminal of PMOS transistor P10 is configured to receive data signal D. A gate terminal of NMOS transistor N10 is configured to receive data signal D. In some embodiments, the gate terminal of PMOS transistor P10 is coupled to the gate terminal of NMOS transistor N10. In some embodiments, the gate terminals of PMOS transistor P10 and NMOS transistor N10 correspond to the first input terminal of multiplexer 302 in FIG. 3A.

A source terminal of NMOS transistor N7 is coupled to the reference voltage supply VSS. A drain terminal of NMOS transistor N7 is coupled to a source terminal of NMOS transistor N8.

A gate terminal of NMOS transistor N8 is configured to receive scan enable signal SE. In some embodiments, the gate terminal of NMOS transistor N8 is coupled to the gate terminal of PMOS transistor P9.

A source terminal of NMOS transistor N9 is coupled to the reference voltage supply VSS. A gate terminal of NMOS transistor N9 is configured to receive inverted scan enable signal SEB. In some embodiments, the gate terminal of NMOS transistor N9 is coupled to the gate terminal of PMOS transistor P8. A drain terminal of NMOS transistor N9 is coupled to a source terminal of NMOS transistor N10.

In some embodiments, at least the gate terminals of PMOS transistor P8 and NMOS transistor N9 or the gate terminals of PMOS transistor P9 and NMOS transistor N8 correspond to the third input terminal of multiplexer 302 in FIG. 3A.

Inverter I1 includes NMOS transistor N11 and PMOS transistor P11.

A gate terminal of PMOS transistor P11 is configured to receive signal Mq_x. A gate terminal of NMOS transistor N11 is configured to receive signal Mq_x. The gate terminal of PMOS transistor P11 is coupled to the gate terminal of NMOS transistor N11. A source terminal of PMOS transistor P11 is coupled to the voltage supply VDD. A drain terminal of PMOS transistor P11 is coupled to a drain terminal of NMOS transistor N11. A source terminal of NMOS transistor N11 is coupled to the reference voltage supply VSS.

Inverter I2 includes NMOS transistor N12 and PMOS transistor P12.

A gate terminal of PMOS transistor P12 is configured to receive signal QF. A gate terminal of NMOS transistor N12 is configured to receive signal QF. The gate terminal of PMOS transistor P12 is coupled to the gate terminal of NMOS transistor N12. A source terminal of PMOS transistor P12 is coupled to the voltage supply VDD. A drain terminal of PMOS transistor P12 is coupled to a drain terminal of NMOS transistor N12. A source terminal of NMOS transistor N12 is coupled to the reference voltage supply VSS.

Inverter I3 includes NMOS transistor N13 and PMOS transistor P13.

A gate terminal of PMOS transistor P13 is configured to receive signal QF_x. A gate terminal of NMOS transistor N13 is configured to receive signal QF_x. The gate terminal of PMOS transistor P13 is coupled to the gate terminal of NMOS transistor N13. A source terminal of PMOS transistor P13 is coupled to the voltage supply VDD. A drain terminal of PMOS transistor P13 is coupled to a drain terminal of NMOS transistor N13. A source terminal of NMOS transistor N13 is coupled to the reference voltage supply VSS.

Inverter 310 includes NMOS transistor N14 and PMOS transistor P14.

A gate terminal of PMOS transistor P14 is configured to receive clock signal CP. A gate terminal of NMOS transistor N14 is configured to receive clock signal CP. The gate terminal of PMOS transistor P14 is coupled to the gate terminal of NMOS transistor N14. A source terminal of PMOS transistor P14 is coupled to the voltage supply VDD. A drain terminal of PMOS transistor P14 is coupled to a drain terminal of NMOS transistor N14. A source terminal of NMOS transistor N14 is coupled to the reference voltage supply VSS.

Inverter 312 includes NMOS transistor N15 and PMOS transistor P15.

A gate terminal of PMOS transistor P15 is configured to receive clock signal CPB. A gate terminal of NMOS transistor N15 is configured to receive clock signal CPB. The gate terminal of PMOS transistor P15 is coupled to the gate terminal of NMOS transistor N15. A source terminal of PMOS transistor P15 is coupled to the voltage supply VDD. A drain terminal of PMOS transistor P15 is coupled to a drain terminal of NMOS transistor N15. A source terminal of NMOS transistor N15 is coupled to the reference voltage supply VSS.

Inverter 314 includes NMOS transistor N16 and PMOS transistor P16.

A gate terminal of PMOS transistor P16 is configured to receive scan enable signal SE. A gate terminal of NMOS transistor N16 is configured to receive scan enable signal SE. The gate terminal of PMOS transistor P16 is coupled to the gate terminal of NMOS transistor N16. A source terminal of PMOS transistor P16 is coupled to the voltage supply VDD. A drain terminal of PMOS transistor P16 is coupled to a drain terminal of NMOS transistor N16. A source terminal of NMOS transistor N16 is coupled to the reference voltage supply VSS.

FIGS. 4A-4E are diagrams of a layout design 400 of an integrated circuit, in accordance with some embodiments. Layout design 400 is a layout diagram of integrated circuit 300A of FIG. 3A or integrated circuit 300B of FIG. 3B.

Layout design 400 is a layout diagram of at least flip-flop 102, 104 or 106 of FIG. 1 or at least flip-flop 102, 104 or 106 of FIG. 3A or FIG. 3B.

Figure 4A:
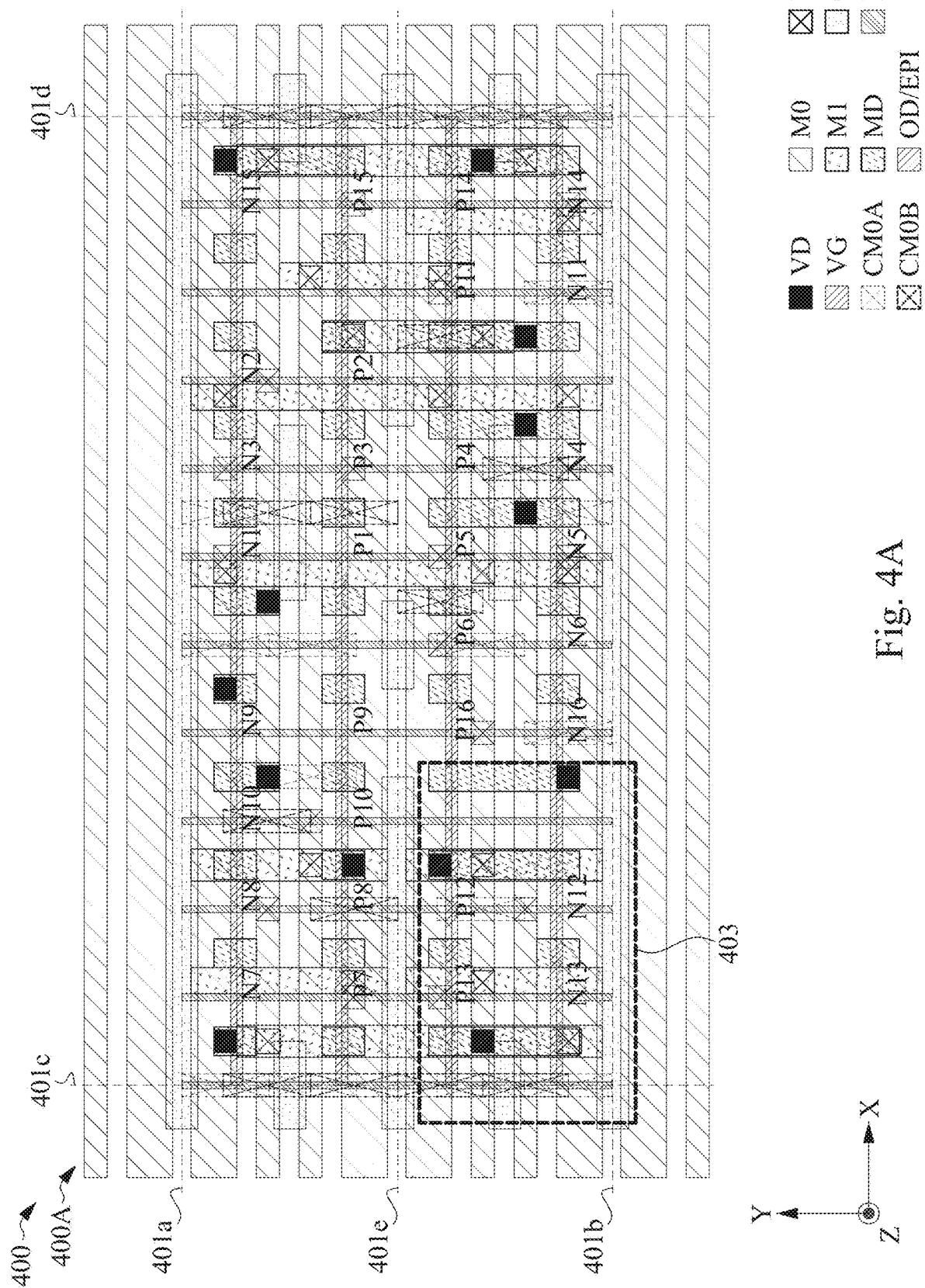
FIGS. 4A-4E are diagrams of a layout design of an integrated circuit, in accordance with some embodiments.
Figure 4B:
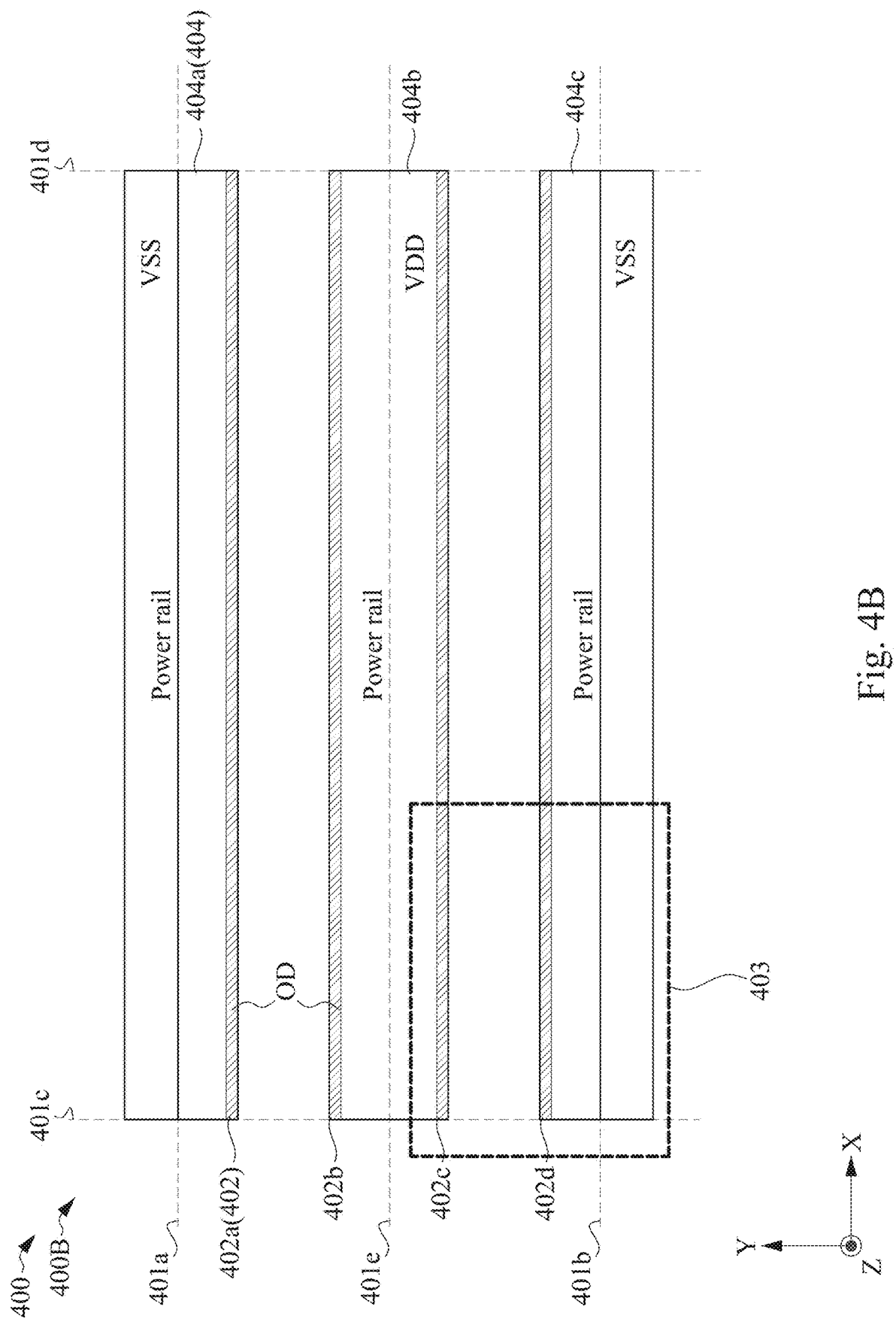
Figure 4C:
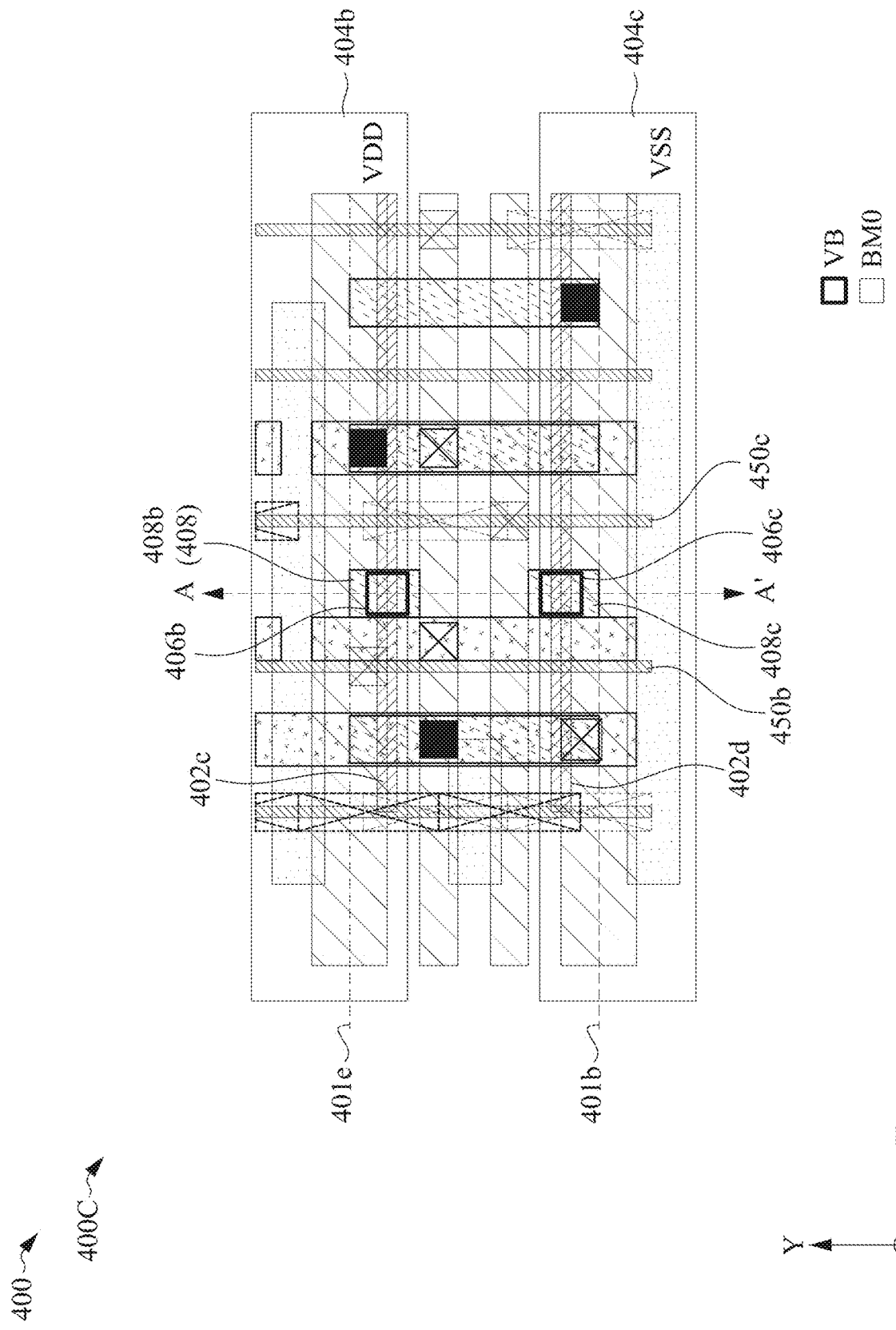

FIG. 4A is a diagram of a layout design 400. For ease of illustration, some of the labeled elements of FIG. 4A are not labelled in FIGS. 4B-4E. In some embodiments, FIGS. 4A-4E include additional elements not shown in FIGS. 4A-4E.

FIGS. 4A-4E are diagrams of a corresponding portion 400A-400E of layout design 400 of FIG. 4A, simplified for ease of illustration. Portion 400A includes one or more features of layout design 400 of FIG. 4A of the oxide diffusion/epitaxial (OD/EPI) level, POLY level, cut poly (CPO) level, metal diffusion (MD) level, via over diffusion (VD) level, via over gate (VG) level, metal 0 (M0) level, V0 level, cut metal 0 (CM0) level and metal 1 (M1) level of layout design 400. Portion 400B includes one or more features of layout design 400 of FIG. 4A of the Buried Power Rail (BPR) level and the oxide diffusion (OD) level of layout design 400.

Portion 400C includes one or more features of layout design 400 of FIG. 4A of the BPR level, VB level, OD/EPI level, POLY level, CPO level, the MD level, the VD level, VG level, the M0 level, V0 level, CM0 level and M1 level of layout design 400. Portion 400C corresponds to a zoomed-in region (labelled as "region 403") of layout design 400 of FIGS. 4A, 4B and 4E for clarity, and similar detailed description is omitted. Region 403 of layout design 400 is labelled in FIGS. 4A and 4E.

Portion 400D includes one or more features of layout design 400 of FIG. 4A of the metal 0 (M0) level, a cut M0 color A (CM0A) level, a cut M0 color B (CM0B) level, a via 0 (V0) level, and a metal 1 (M1) level of layout design 400.

Portion 400E includes one or more features of layout design 400 of FIG. 4A of the OD/EPI level, POLY level, CPO level, the MD level, the VD level, VG level, the M0 level, V0 level, CM0 level and M1 level of layout design 400. Portion 400E of FIG. 4E corresponds to portion 400A of FIG. 4A, but portion 400A and 400E include different labels for ease of illustration. For example, portion 400A identifies each of the locations of the PMOS and NMOS transistors from integrated circuit 300B, and similar detailed description is omitted. For example, portion 400E does not identify the locations of the PMOS and NMOS transistors from integrated circuit 300B for ease of illustration, but portion 400E includes labels for each of the set of gate layout patterns 450 and set of cut gate layout patterns 452, and similar detailed description is omitted.

Layout design 400 is usable to manufacture integrated circuit 300A of FIG. 3A or integrated circuit 300B of FIG. 3B. Layout design 400 is usable to manufacture at least flip-flop 102, 104 or 106 of FIG. 1 or at least flip-flop 102, 104 or 106 of FIG. 3A or FIG. 3B.

Layout design 400 has a cell boundary 401a and cell boundary 401b that extend in a first direction X, a cell boundary 401c and 401d that extend in a second direction Y, and a mid-point 401e that extends in the first direction X. Layout design 400 has a height (not labelled) in a second direction Y from cell boundary 401b to cell boundary 401a. In some embodiments, the second direction Y is different from the first direction X. In some embodiments, layout design 400 abuts other cell layout designs (shown in FIGS. 6A and 7A) along cell boundaries 401a and 401 b.

Layout design 400 includes active region layout patterns 402a, 402b, 402c and 402d (collectively referred to as a "set of active region layout patterns 402") extending in the first direction X. Active region layout patterns 402a, 402b, 402c, 402d of the set of active region layout patterns 402 are separated from one another in the second direction Y. The set of active region layout patterns 402 is usable to manufacture a corresponding set of active regions 502 (FIG. 5) of integrated circuit 500. In some embodiments, the set of active regions 502 are located on a front-side of integrated circuit 500. In some embodiments, the set of active regions 502 are also known as a set of epitaxial regions 502. In some embodiments, active region layout patterns 402a, 402b, 402c, 402d of the set of active region layout patterns 402 are usable to manufacture corresponding active regions 502a, 502b, 502c, 502d of the set of active regions 502 (FIGS. 5A-5E) of integrated circuit 500.

In some embodiments, the set of active region layout patterns 402 is referred to as an oxide diffusion (OD) region which defines the source or drain diffusion regions of at least integrated circuit 300A, 300B or 500.

In some embodiments, at least active region layout pattern 402a or 402d of the set of active region layout patterns 402 is usable to manufacture source and drain regions of NMOS transistors of integrated circuits 300A-300B, and at least active region layout pattern 402b or 402c of the set of active region layout patterns 402 is usable to manufacture source and drain regions of PMOS transistors of integrated circuits 300A-300B. For example, in these embodiments, at least active region layout pattern 402a or 402d of the set of active region layout patterns 402 is usable to manufacture source and drain regions of one or more of NMOS transistors N1, N2, N3, N4, N5, N6, N7, N8, N9, N10, N11, N12, N13, N14, N15 or N16, and at least active region layout pattern 402b or 402c of the set of active region layout patterns 402 is usable to manufacture source and drain regions of PMOS transistors P1, P2, P3, P4, P5, P6, P7, P8, P9, P10, P11, P12, P13, P14, P15 or P16. In some embodiments, at least active region layout pattern 402a or 402d of the set of active region layout patterns 402 is usable to manufacture source and drain regions of PMOS transistors of integrated circuits 300A-300B, and at least active region layout pattern 402b or 402c of the set of active region layout patterns 402 is usable to manufacture source and drain regions of NMOS transistors of integrated circuits 300A-300B. For example, in these embodiments, at least active region layout pattern 402a or 402d of the set of active region layout patterns 402 is usable to manufacture source and drain regions of one or more of PMOS transistors P1, P2, P3, P4, P5, P6, P7, P8, P9, P10, P11, P12, P13, P14, P15 or P16, and at least active region layout pattern 402b or 402c of the set of active region layout patterns 402 is usable to manufacture source and drain regions of NMOS transistors N1, N2, N3, N4, N5, N6, N7, N8, N9, N10, N11, N12, N13, N14, N15 or N16.

In some embodiments, the set of active region layout patterns 402 is located on a first layout level. In some embodiments, the first layout level corresponds to an active level or an OD level of one or more of layout designs 400, 600A or 700A (FIGS. 4A-4D, 6A or 7A) or integrated circuit 500, 600B or 700B (FIG. 5, 6B or 7B). In some embodiments, the OD level is also referred to as the EPI level.

Other configurations, arrangements on other layout levels or quantities of patterns in the set of active region layout patterns 402 are within the scope of the present disclosure.

Layout design 400 further includes one or more power rail layout patterns 404a, 404b or 404c (collectively referred to as a "set of power rail layout patterns 404") extending in the first direction X, and being located on a second layout level. In some embodiments, the second layout level is different from the first layout level. In some embodiments, the second layout level corresponds to a buried power rail (BPR) level of one or more of layout designs 400, 600A or 700A (FIGS. 4A-4D, 6A or 7A) or integrated circuit 500, 600B or 700B (FIG. 5, 6B or 7B). In some embodiments, the BPR level is below the OD level.

The set of power rail layout patterns 404 is usable to manufacture a corresponding set of power rails 504 of integrated circuit 500 (FIG. 5). In some embodiments, the set of power rails 504 are located on a back-side of integrated circuit 500. In some embodiments, power rail layout patterns 404a, 404b, 404c of the set of power rail layout patterns 404 is usable to manufacture corresponding power rails 504a, 504b, 504c of the set of power rails 504 (FIG. 5) of integrated circuit 500.

In some embodiments, the set of power rails 504 is configured to provide a first supply voltage of a voltage supply VDD or second supply voltage of a reference voltage supply VSS to the integrated circuit, such as integrated circuit 500.

In some embodiments, power rails 504a and 504c are configured to provide the first supply voltage of voltage supply VDD, and power rail 504b is configured to provide the second supply voltage of reference voltage supply VSS. In some embodiments, power rails 504a and 504c are configured to provide the second supply voltage of reference voltage supply VSS, and power rail 504b is configured to provide the first supply voltage of voltage supply VDD.

In some embodiments, power rail layout patterns 404*a* and 404*c* of the set of power rail layout patterns 404 are located along corresponding cell boundaries 401*a* and 401*b* of layout design 400. In some embodiments, power rail layout pattern 404*b* of the set of power rail layout patterns 404 is located along a mid-point 401*e* of layout design 400 in the first direction X.

Other configurations, arrangements on other layout levels or quantities of patterns in the set of power rail layout patterns 404 are within the scope of the present disclosure.

Layout design 400 further includes one or more via layout patterns 406*a* (not labelled), 406*b*, 406*c*, . . . , 406*z* (collectively referred to as a "set of via layout patterns 406"), where z is an integer corresponding to the number of via layout patterns in set of via layout patterns 406. For ease of illustration, one or more via layout patterns of the set of via layout patterns 406 are not labelled. The set of via patterns 406 is positioned at a via buried power (VB) level of one or more of layout designs 400, 600A or 700A (FIGS. 4A-4D, 6A or 7A) or integrated circuit 500, 600B or 700B (FIG. 5, 6B or 7B). In some embodiments, the VB level is between the OD level and the BPR level. In some embodiments, the VBP level is between the BP level and at least the OD level or the MD level. In some embodiments, the VBP level is between the first layout level and at least the second layout level. Other layout levels are within the scope of the present disclosure.

Via layout pattern 406*b* is between power rail layout pattern 404*b* and active region layout pattern 402*c*. In some embodiments, via layout pattern 406*b* is between power rail layout pattern 404*b* and contact layout pattern 408*b*. Via layout pattern 406*c* is between power rail layout pattern 404*c* and active region layout pattern 402*d*. In some embodiments, via layout pattern 406*c* is between power rail layout pattern 404*c* and contact layout pattern 408*c*. In some embodiments, at least one via layout pattern of the set of via patterns 406 is not included in layout design 100.

Other configurations, arrangements on other layout levels or quantities of patterns in the set of via patterns 406 are within the scope of the present disclosure.

Layout design 400 further includes one or more contact layout patterns 408*a*, 408*b*, 408*c*, . . . , 408*o* (collectively referred to as a "set of contact layout patterns 408") and one or more contact layout patterns 409*a*, 409*b*, 409*c*, . . . , 409*u* (collectively referred to as a "set of contact layout patterns 409") extending in the second direction Y. Each of the contact layout patterns of the set of contact layout patterns 408 is separated from an adjacent contact layout pattern of the set of contact layout patterns 408 in the first direction X. Each of the contact layout patterns of the set of contact layout patterns 409 is separated from an adjacent contact layout pattern of the set of contact layout patterns 409 in the first direction X. For ease of illustration, one or more contact layout patterns of the set of contact layout patterns 408 or contact layout patterns of the set of contact layout patterns 409 are not labelled.

The set of contact layout patterns 408 correspond to contact layout patterns between cell boundary 401*b* and mid-point 401*e*. The set of contact layout patterns 409 correspond to contact layout patterns between cell boundary 401*a* and mid-point 401*e*.

The set of contact layout patterns 408 is usable to manufacture a corresponding set of contacts 508 (FIGS. 5A-5E) of integrated circuit 500. The set of contact layout patterns 409 is usable to manufacture a corresponding set of contacts 509 (FIGS. 5A-5E) of integrated circuit 500.

In some embodiments, contact layout pattern 408*a*, 408*b*, 408*c*, . . . , 408*o* of the set of contact layout patterns 408 is usable to manufacture corresponding contact 508*a*, 508*b*, 508*c*, . . . , 508*o* of the set of contact layout patterns 508. In some embodiments, contact layout pattern 409*a*, 409*b*, 409*c*, . . . , 409*u* of the set of contact layout patterns 409 is usable to manufacture corresponding contact 509*a*, 509*b*, 509*c*, . . . , 509*u* of the set of contact layout patterns 509. In some embodiments, the set of contact layout patterns 408 or 409 is also referred to as a set of metal over diffusion (MD) layout patterns.

In some embodiments, at least one of contact layout pattern 408*a*, 408*b*, 408*c*, . . . , 408*o* of the set of contact layout patterns 408 is usable to manufacture source or drain terminals of one of the NMOS or PMOS transistors of integrated circuit 500, at least one of contact layout pattern 409*a*, 409*b*, 409*c*, . . . , 409*u* of the set of contact layout patterns 409 is usable to manufacture source or drain terminals of one of the NMOS or PMOS transistors of integrated circuit 500.

In some embodiments, the set of contact layout patterns 408 overlap the set of active region patterns 402. The set of contact layout patterns is located on a fifth layout level. In some embodiments, the fifth layout level is different from the first layout level, the second layout level, the third layout level and the fourth layout level. In some embodiments, the fifth layout level is above the first layout level and the second layout level.

In some embodiments, the fifth layout level corresponds to contact level or an MD level of one or more of layout designs 400, 600A or 700A (FIGS. 4A-4D, 6A or 7A) or integrated circuit 500, 600B or 700B (FIG. 5, 6B or 7B).

Other configurations, arrangements on other layout levels or quantities of patterns in the set of contact layout patterns 408 are within the scope of the present disclosure.

Layout design 400 further includes one or more conductive feature layout patterns 420*a*, 420*b*, 420*c*, 420*d*, 420*e*, 420*f*, 420*g* or 420*h* (collectively referred to as a "set of conductive feature layout patterns 420") extending in the first direction X, and being located on a third layout level. In some embodiments, the third layout level is different from the first layout level and the second layout level. In some embodiments, the third layout level corresponds to a metal 0 (M0) level of one or more of layout designs 400, 600A or 700A (FIGS. 4A-4D, 6A or 7A) or integrated circuit 500, 600B or 700B (FIG. 5, 6B or 7B). In some embodiments, the M0 level is above the OD level and the BPR level.

The set of conductive feature layout patterns 420 is usable to manufacture a corresponding set of conductive structures 520 (FIG. 5C) of integrated circuit 500. Conductive feature layout patterns 420*a*, 420*b*, 420*c*, 420*d*, 420*e*, 420*f*, 420*g*, 420*h* are usable to manufacture corresponding conductive structures 520*a*, 520*b*, 520*c*, 520*d*, 520*e*, 520*f*, 520*g*, 520*h* (FIG. 5C).

The set of conductive feature layout patterns 420 overlaps at least one power rail layout pattern of the set of power rail layout patterns 404.

In some embodiments, the set of conductive feature layout patterns 420 overlaps other underlying layout patterns (not shown) of other layout levels (e.g., Active, MD, POLY or the like) of layout design 400.

In some embodiments, each layout pattern 420*a*, 420*b*, 420*c*, 420*d*, 420*e*, 420*f*, 420*g*, 420*h* of the set of conductive feature layout patterns 420 overlaps a corresponding gridline 422*a*, 422*b*, 422*c*, 422*d*, 422*e*, 422*f*, 422*g*, 422*h* of a set of gridlines 422. In some embodiments, a center of each layout pattern 420*a*, 420*b*, 420*c*, 420*d*, 420*e*, 420*f*, 420*g*, 420*h* of the set of conductive feature layout patterns 420 is aligned in the first direction X with a corresponding gridline 422a, 422b, 422c, 422d, 422e, 422f, 422g, 422h of a set of gridlines 422.

At least layout pattern 420b, 420c, 420f or 420g of the set of conductive feature layout patterns 420 has a width W1 in the second direction Y. At least layout pattern 420a, 420d, 420e or 420h of the set of conductive feature layout patterns 420 has a width W2 in the second direction Y. Width W2 is different from width W1. In some embodiments, width W2 is the same as width W1.

Other widths for the set of conductive feature layout patterns 420 is within the scope of the present disclosure. In some embodiments, at least conductive feature layout pattern 420b, 420c, 420f or 420g of the set of conductive feature layout patterns 420 has width W2 in the second direction Y. In some embodiments, at least conductive feature layout pattern 420a, 420d, 420e or 420h of the set of conductive feature layout patterns 420 has width W1 in the second direction Y.

In some embodiments, conductive feature layout patterns 420a, 420b, 420c, 420d, 420e, 420f, 420g, 420h of the set of conductive feature layout patterns 420 correspond to 8 M0 routing tracks in layout design 400. Other numbers of M0 routing tracks are within the scope of the present disclosure. In some embodiments, as the number of M0 tracks are increased, the number of conductive feature layout patterns of the set of conductive feature layout patterns 420 having width W2 is decreased to maintain sufficient separation between adjacent conductive feature layout patterns of the set of conductive feature layout patterns 420 to satisfy minimum spacing requirements that ensure sufficient manufacturing yield that overcomes manufacturing variations. In some embodiments, as the number of M0 tracks are decreased, the number of conductive feature layout patterns of the set of conductive feature layout patterns 420 having width W2 is increased while maintaining sufficient separation between adjacent conductive feature layout patterns of the set of conductive feature layout patterns 420 to satisfy minimum spacing requirements that ensure sufficient manufacturing yield that overcomes manufacturing variations.

In some embodiments, layout design 400 further includes one or more conductive feature layout patterns 430a or 430b (collectively referred to as a "set of conductive feature layout patterns 430") or one or more conductive feature layout patterns 432a or 432b (collectively referred to as a "set of conductive feature layout patterns 432") extending in the first direction X, and being located on the third layout level. In some embodiments, the set of conductive feature layout patterns 430 and 432 are similar to the set of conductive feature layout patterns 420, and similar detailed description is therefore omitted.

In some embodiments, the set of conductive feature layout patterns 430 and 432 are part of corresponding layout designs (similar to layout design 400) that abut layout design 400 along corresponding cell boundaries 401a and 401b.

In some embodiments, conductive feature layout patterns 420a and 430a are offset in the second direction Y from cell boundary 401a, and are referred to as "sharing space." In some embodiments, conductive feature layout patterns 420h and 432a are offset in the second direction Y from cell boundary 401a, and are referred to as "sharing space."

Figure 6A:
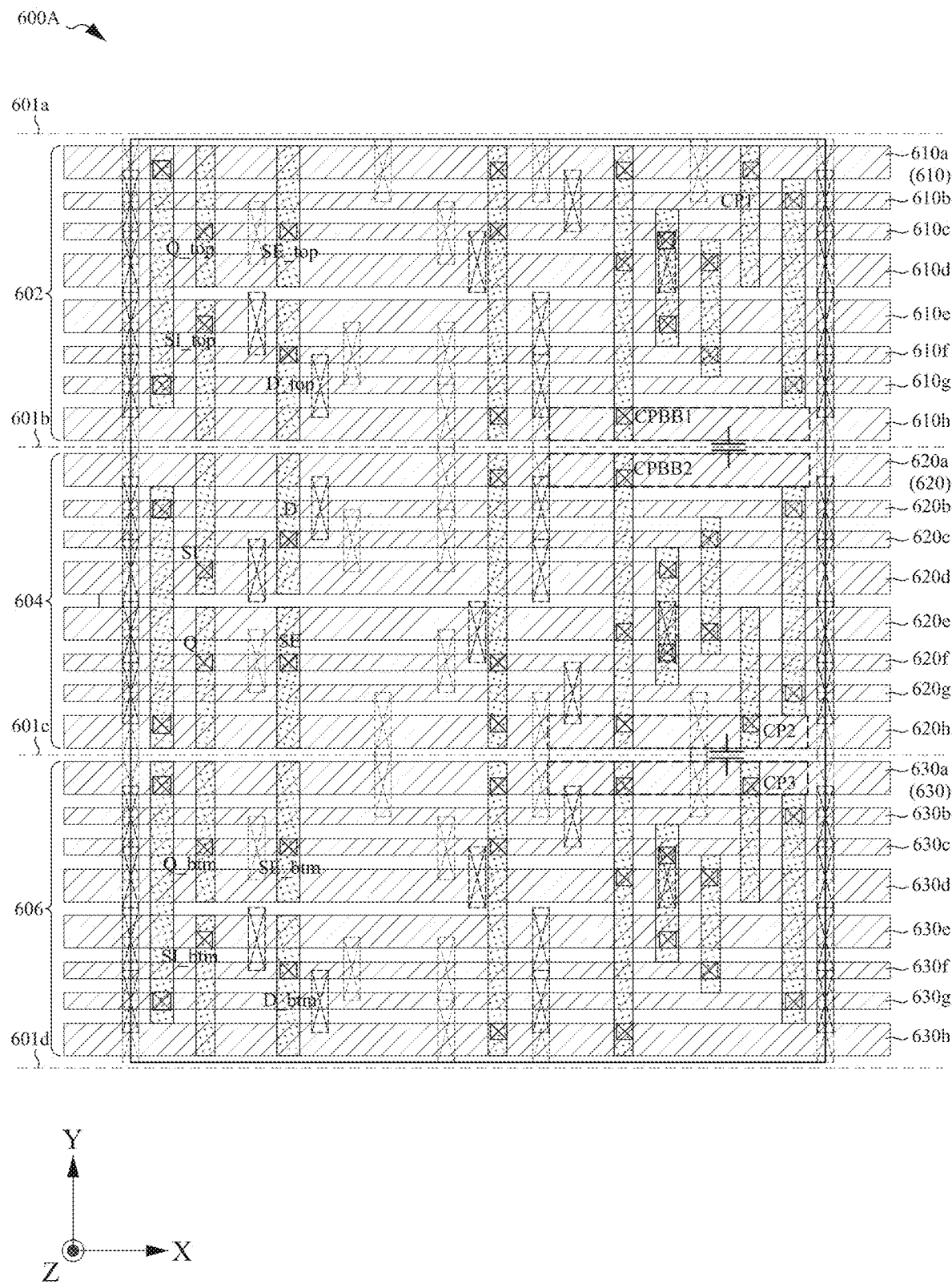
FIG. 6A is a diagram of a layout design of an integrated circuit, in accordance with some embodiments.
Figure 7A:
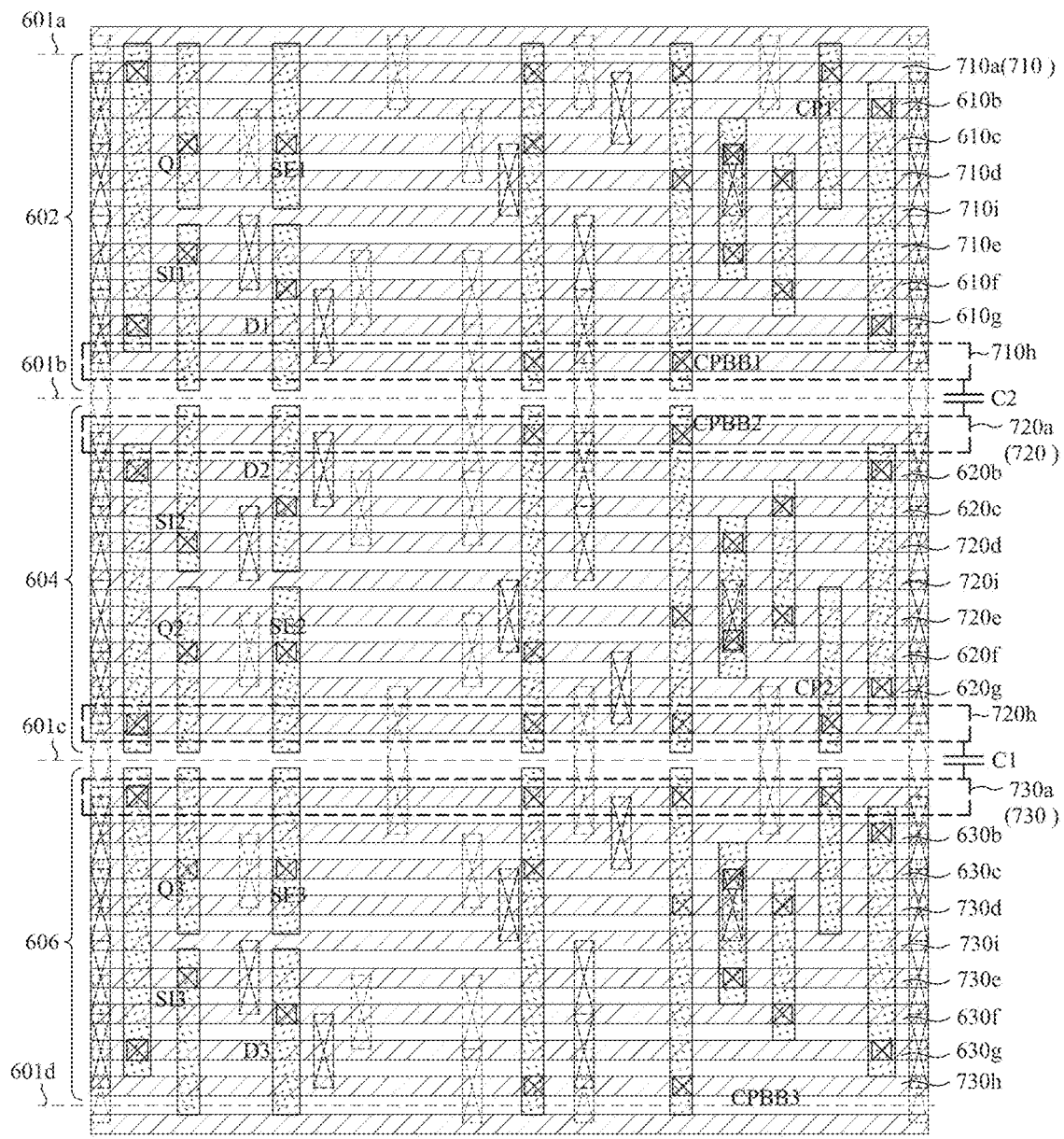
FIG. 7A is a diagram of a layout design of an integrated circuit, in accordance with some embodiments.
Figure 7B:
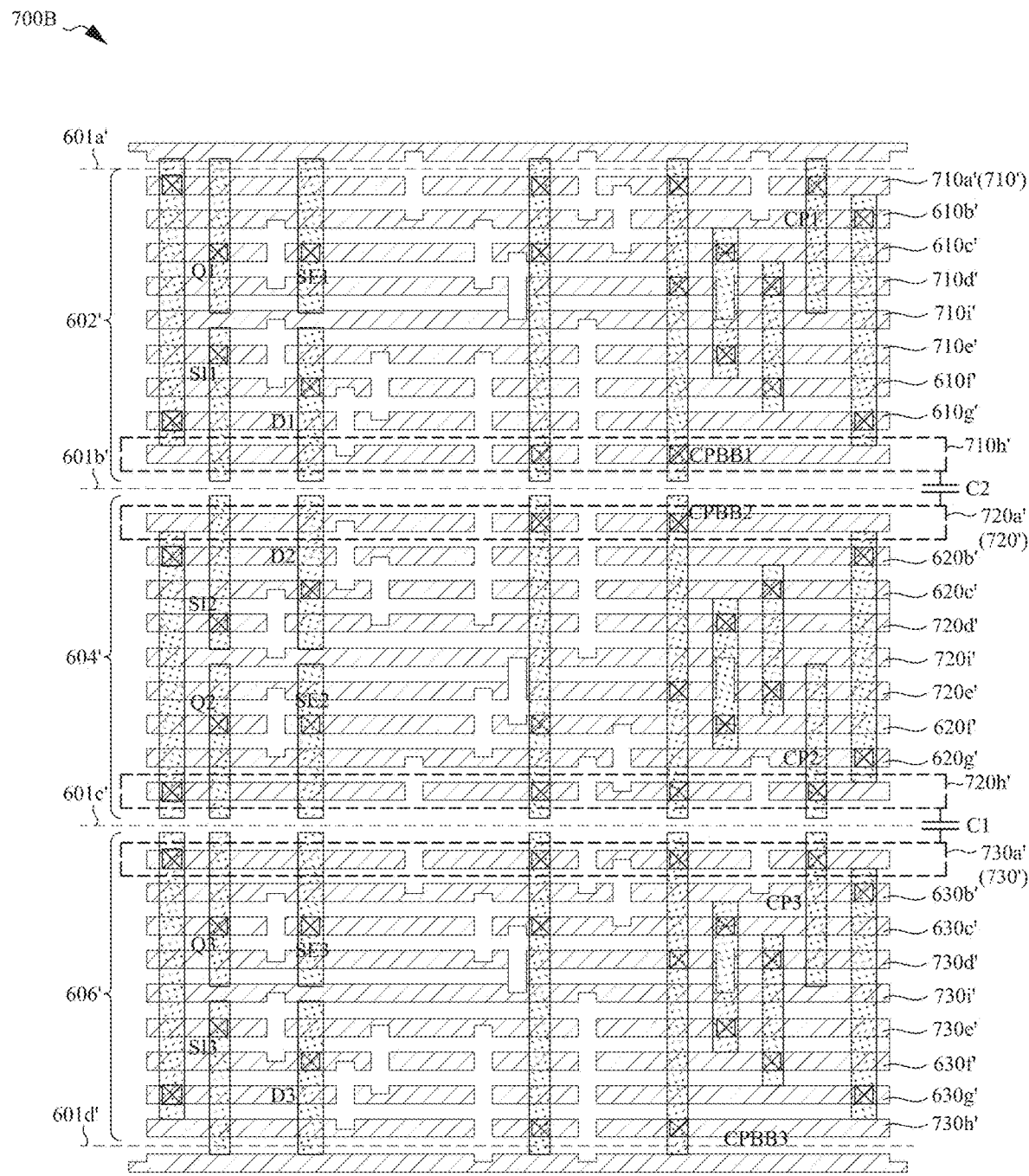
FIG. 7B is a top view of an integrated circuit, in accordance with some embodiments.

In some embodiments, by positioning conductive feature layout patterns 420a and 420h of the set of conductive feature layout patterns 420 to be offset from corresponding cell boundaries 401a and 401b, causes conductive feature layout patterns 420b, 420c, 420d, 420e, 420f and 420g of the set of conductive feature layout patterns 420 to be shifted in the second direction Y from cell boundary 401b compared with other approaches, thereby causing additional space between similar corresponding conductive feature layout patterns of abutting layout designs (e.g., as shown in FIGS. 6A & 7A), resulting in less coupled capacitance than other approaches.

Other configurations, arrangements on other layout levels or quantities of patterns in the set of conductive feature layout patterns 420 are within the scope of the present disclosure.

Layout design 400 further includes one or more via layout patterns 456a (not labelled), 456b, 456c, . . . , 456o (collectively referred to as a "set of via layout patterns 456"). For ease of illustration, one or more via layout patterns of the set of via layout patterns 456 are not labelled. The set of via patterns 456 is positioned at a via over diffusion (VD) level of one or more of layout designs 400, 600A or 700A (FIGS. 4A-4D, 6A or 7A) or integrated circuit 500, 600B or 700B (FIG. 5, 6B or 7B). In some embodiments, the VD level is between the MD level and the M0 level. In some embodiments, the VD level is between the fifth layout level and at least the third layout level. In some embodiments, at least one via layout pattern of the set of via patterns 456 is not included in layout design 400. Other layout levels are within the scope of the present disclosure.

Other configurations, arrangements on other layout levels or quantities of patterns in the set of via patterns 456 are within the scope of the present disclosure.

Layout design 400 further includes one or more conductive feature layout patterns 424a, 424b, 424c, 424d, 424e, 424f, 424g, 424h, 424i, 424j or 424k (collectively referred to as a "set of conductive feature layout patterns 424") extending in the second direction Y, and being located on a fourth layout level. In some embodiments, the fourth layout level is different from the first layout level, the second layout level and the third layout level. In some embodiments, the fourth layout level corresponds to a metal 1 (M1) level of one or more of layout designs 400, 600A or 700A (FIGS. 4A-4D, 6A or 7A) or integrated circuit 500, 600B or 700B (FIG. 5, 6B or 7B). In some embodiments, the M1 level is above the OD level, the BPR level and the M0 level.

In some embodiments, each conductive feature layout pattern of the set of conductive feature layout patterns 424 is separated from an adjacent conductive feature layout pattern in the first direction X.

The set of conductive feature layout patterns 424 is usable to manufacture a corresponding set of conductive structures 524 (FIG. 5) of integrated circuit 500. Conductive feature layout patterns 424a, 424b, 424c, 424d, 424e, 424f, 424g, 424h, 424i, 424j, 424k are usable to manufacture corresponding conductive structures 524a, 524b, 524c, 524d, 524e, 524f, 524g, 524h, 524i, 524j, 524k (FIG. 5).

The set of conductive feature layout patterns 424 overlap the set of conductive feature layout patterns 420. In some embodiments, layout patterns 424a, 424f, 424g and 424k overlap at least conductive feature layout pattern 420b, 420c, 420d, 420e, 420f or 420h. In some embodiments, layout patterns 424b and 424d overlap at least conductive feature layout pattern 420a, 420b, 420c or 420d. In some embodiments, layout patterns 424c, 424e and 424j overlap at least conductive feature layout pattern 420e, 420f, 420g or 420h. In some embodiments, layout pattern 424h overlaps at least conductive feature layout pattern 420d, 420e or 420f. In some embodiments, layout pattern 424i overlaps at least conductive feature layout pattern 420c, 420d or 420e.

In some embodiments, the set of conductive feature layout patterns 424 overlaps the set of gridlines 422. In some embodiments, the set of conductive feature layout patterns 424 overlaps other underlying layout patterns (not shown) of other layout levels (e.g., BPR, Active, MD, M0, V0 or the like) of layout design 400.

Other configurations, arrangements on other layout levels or quantities of patterns in the set of conductive feature layout patterns 424 are within the scope of the present disclosure.

Layout design 400 further includes one or more via layout patterns 426a, 426b, 426r or 426s (collectively referred to as a "set of via layout patterns 426").

Figure 5A:
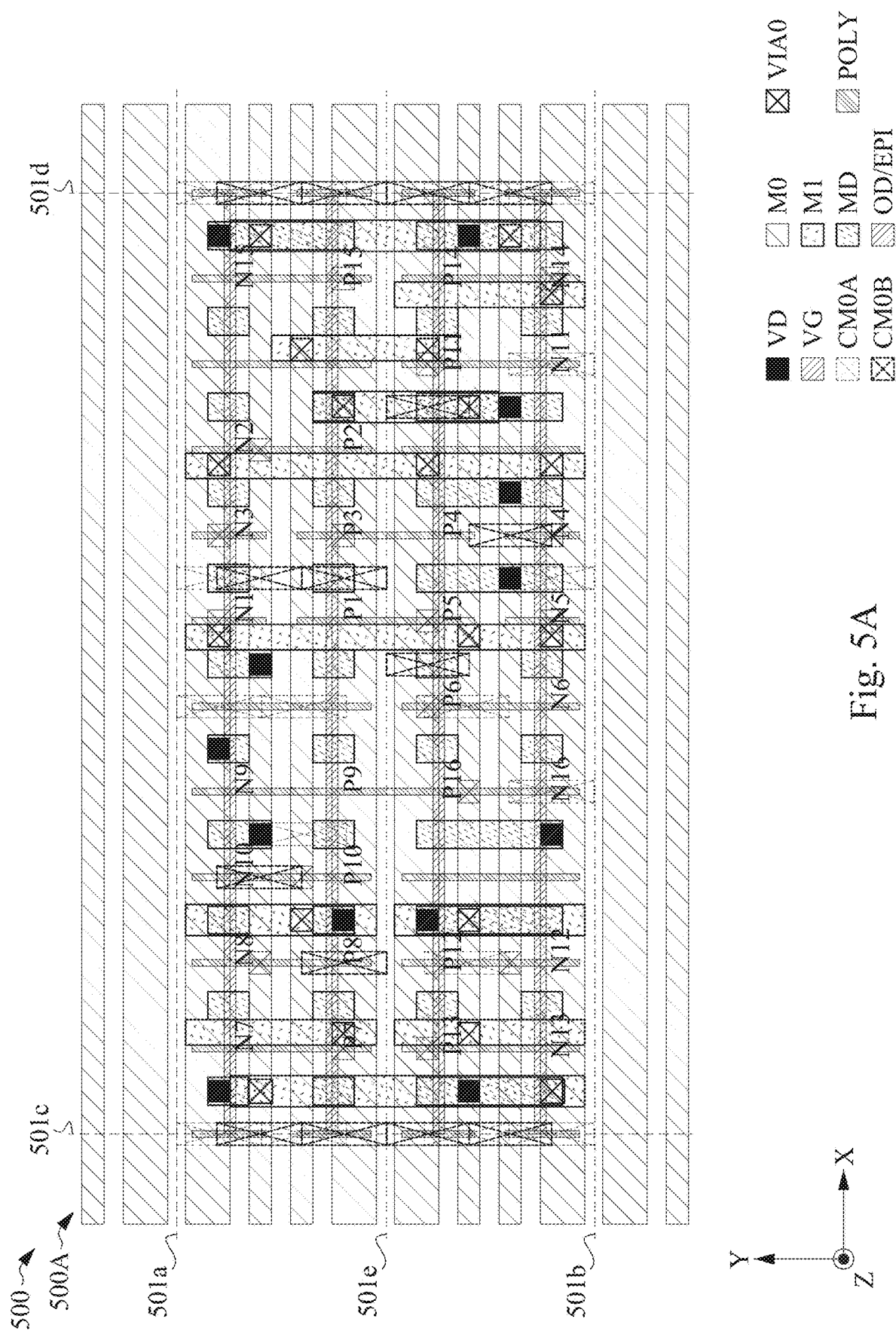
FIGS. 5A-5E are diagrams of an integrated circuit, in accordance with some embodiments.
Figure 5B:
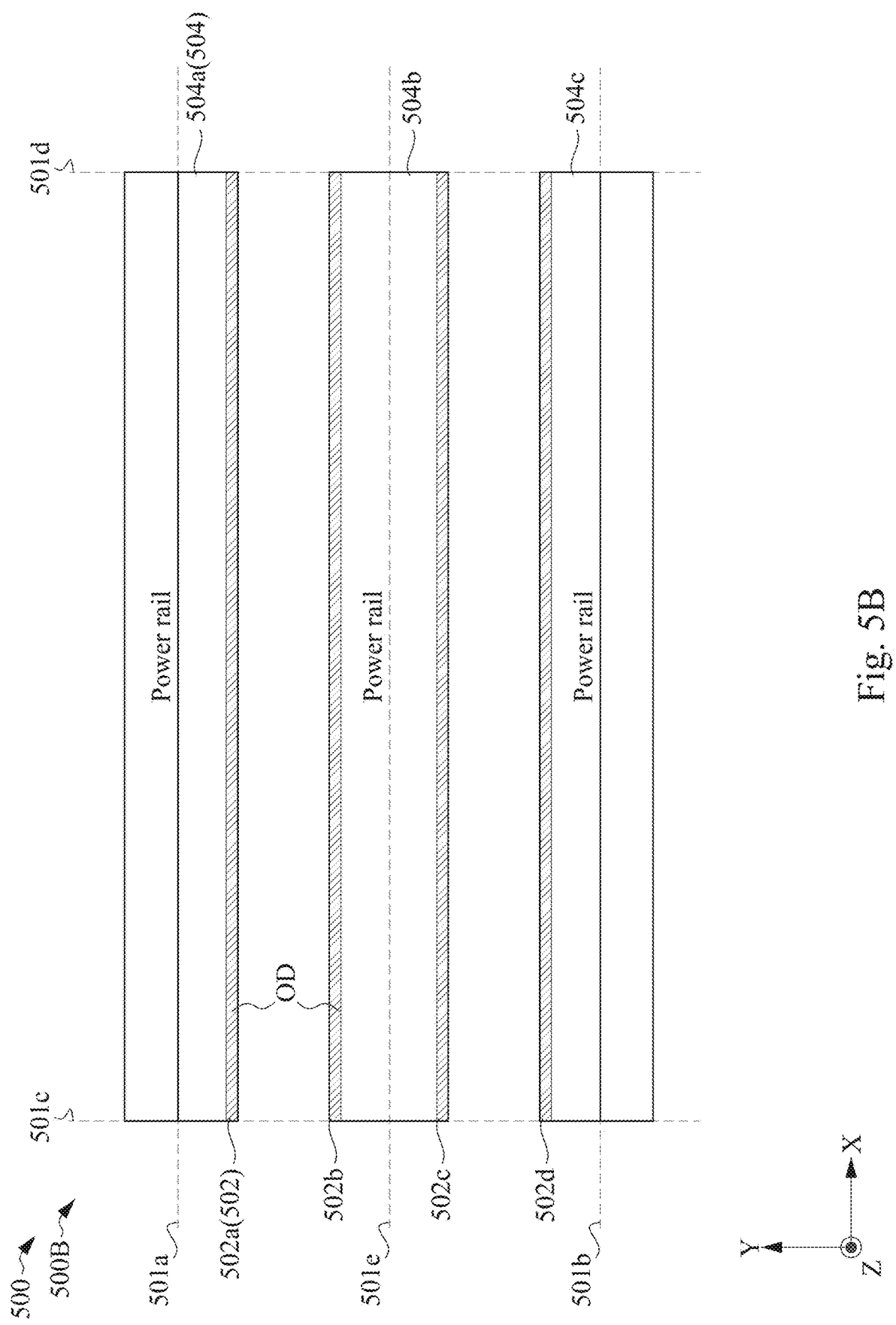
Figure 5C:
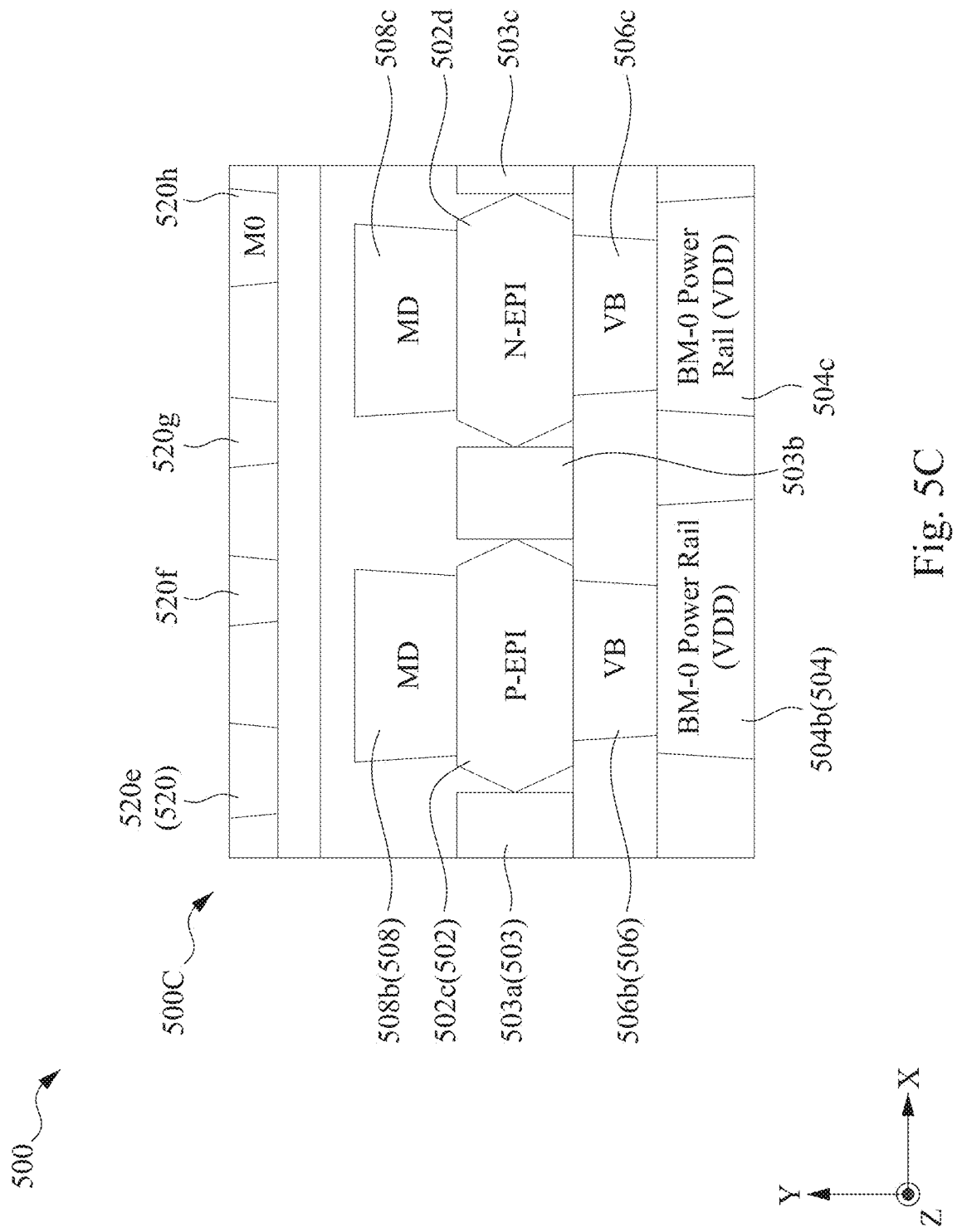
Figure 5D:
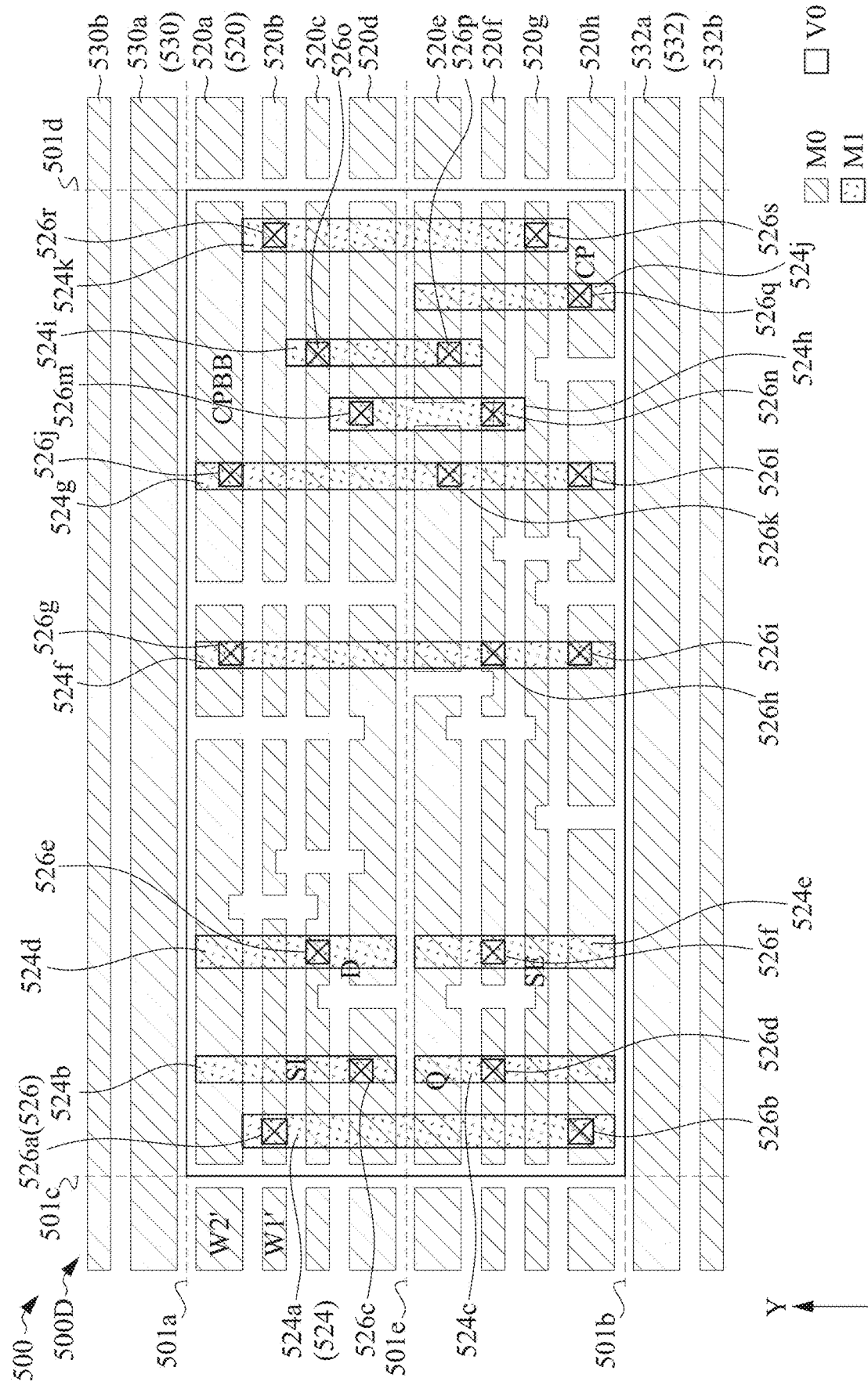
Figure 5E:
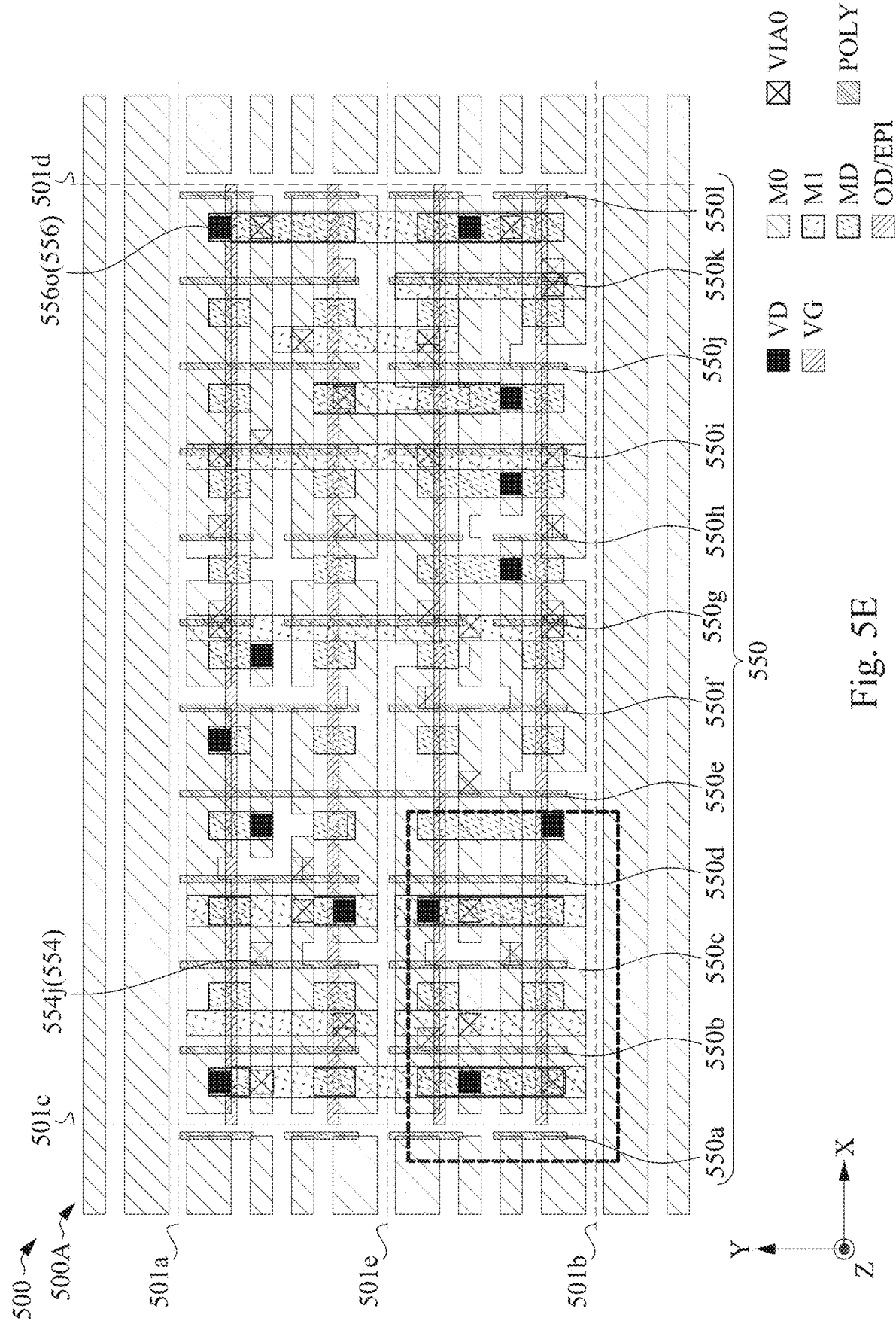
Figure 6B:
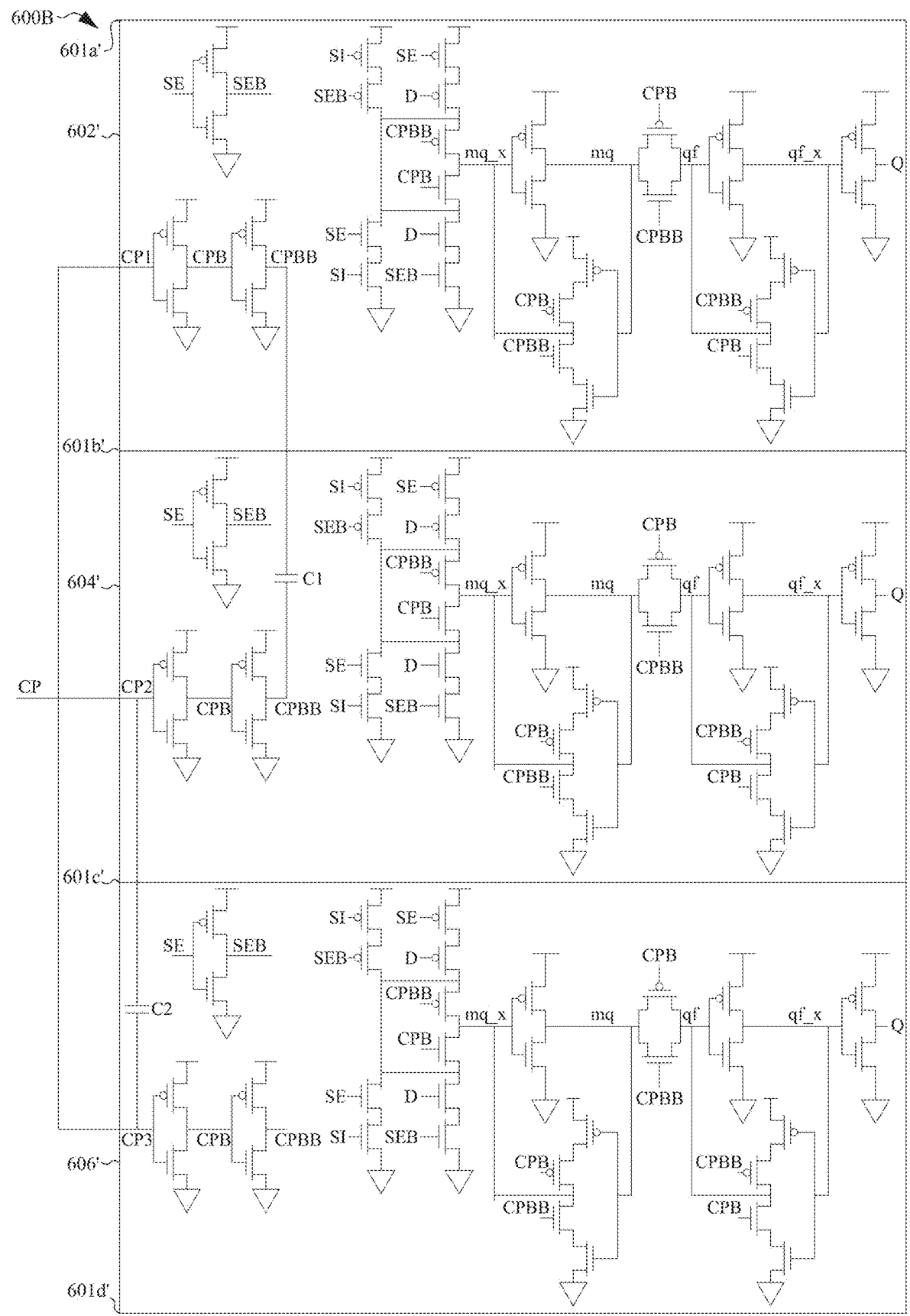
FIG. 6B is a schematic view of a diagram of an integrated circuit, in accordance with some embodiments.

The set of via layout patterns 426 is usable to manufacture a corresponding set of vias 526 (FIG. 5D). In some embodiments, via layout patterns 426a, 426b, 426r or 426s of the set of via layout patterns 426 is usable to manufacture corresponding vias 526a, 526b, . . . , 526r or 526s of the set of vias 526 (FIG. 5D) of integrated circuit 500. In some embodiments, the set of via layout patterns 426 are between the set of conductive feature layout patterns 420 and the set of conductive feature layout patterns 424.

Set of via layout patterns 426 are positioned at a via zero (V0) level of one or more of layout designs 400, 600A or 700A (FIGS. 4A-4D, 6A or 7A) or integrated circuit 500, 600B or 700B (FIGS. 5, 6B or 7B). In some embodiments, the V0 level is between the M0 level and the M1 level. In some embodiments, the V0 level is between the fourth layout level and the third layout level. Other layout levels are within the scope of the present disclosure.

Via layout patterns 426a and 426b are between conductive feature layout pattern 424a and corresponding conductive feature layout patterns 420b and 420h. Via layout pattern 426c is between conductive feature layout patterns 424b and 420d. Via layout pattern 426d is between conductive feature layout patterns 424c and 420f. Via layout pattern 426e is between conductive feature layout patterns 424d and 420c. Via layout pattern 426f is between conductive feature layout patterns 424e and 420f. Via layout patterns 426g, 426h and 426i are between conductive feature layout pattern 424f and corresponding conductive feature layout patterns 420a, 420f and 420h. Via layout patterns 426j, 426k and 426l are between conductive feature layout pattern 424g and corresponding conductive feature layout patterns 420a, 420e and 420h. Via layout patterns 426m and 426n are between conductive feature layout pattern 424h and corresponding conductive feature layout patterns 420d and 420f. Via layout patterns 426o and 426p are between conductive feature layout pattern 424i and corresponding conductive feature layout patterns 420c and 420e. Via layout pattern 426q is between conductive feature layout patterns 424j and 420h. Via layout patterns 426r and 426s are between conductive feature layout pattern 424k and corresponding conductive feature layout patterns 420b and 420g. In some embodiments, at least one via layout pattern of the set of via layout patterns 426 is not included in layout design 400.

Other configurations, arrangements on other layout levels or quantities of patterns in the set of via layout patterns 426 are within the scope of the present disclosure.

Layout design 400 further includes one or more cut feature layout patterns 440a, 440b, . . . , 440g or 440h (collectively referred to as a "set of cut feature layout patterns 440") or one or more cut feature layout patterns 442a, 442b, 442i or 442j (collectively referred to as a "set of cut feature layout patterns 442"). The set of cut feature layout patterns 440 and 442 extend in the second direction Y. In some embodiments, each cut feature layout pattern 440a, 440b, . . . , 440g or 440h of the set of cut feature layout patterns 440 or each cut feature layout pattern 442a, 442b, . . . , 442i or 442j of the set of cut feature layout patterns 442 is separated from an adjacent cut feature layout pattern in at least the first direction X or the second direction Y. The set of cut feature layout patterns 440 and 442 are located on the third layout level.

In some embodiments, the set of cut feature layout patterns 440 and 442 overlap at least a portion of a layout pattern of the set of conductive feature layout patterns 420. In some embodiments, the set of cut feature layout patterns 440 and 442 overlap other underlying layout patterns (not shown) of other layout levels (e.g., BPR, Active, MD, or the like) of layout design 400.

Figure 8:
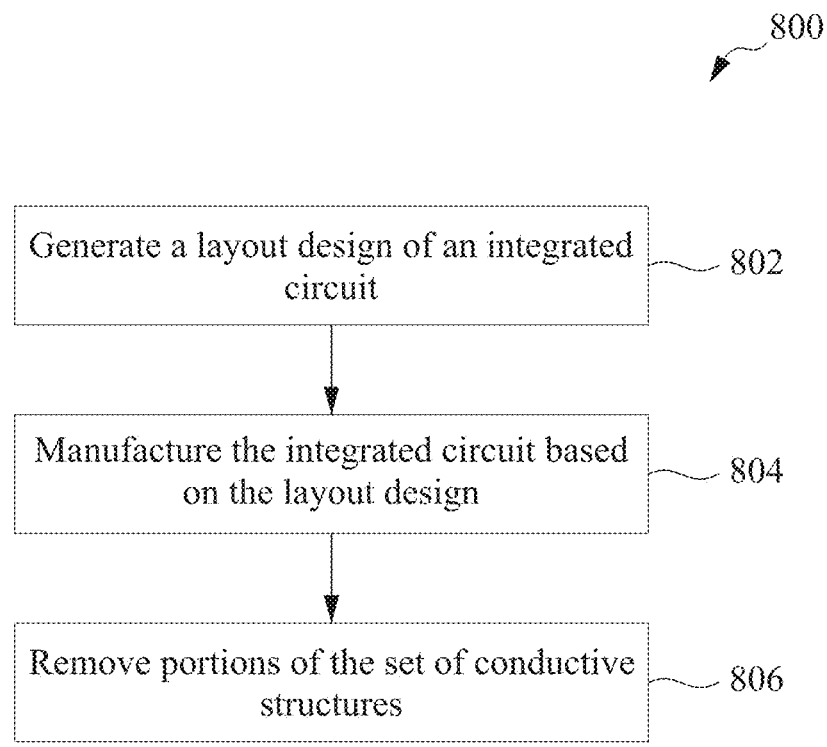
FIG. 8 is a flowchart of a method of forming or manufacturing an integrated circuit, in accordance with some embodiments.

In some embodiments, cut feature layout patterns 440a, 440b, . . . , 440g or 440h and cut feature layout patterns 442a, 442b, 442i or 442j identify corresponding locations of corresponding portions (not labelled) of the set of conductive structures 520 that are removed in operation 806 of method 800 (FIG. 8).

Figure 4D:
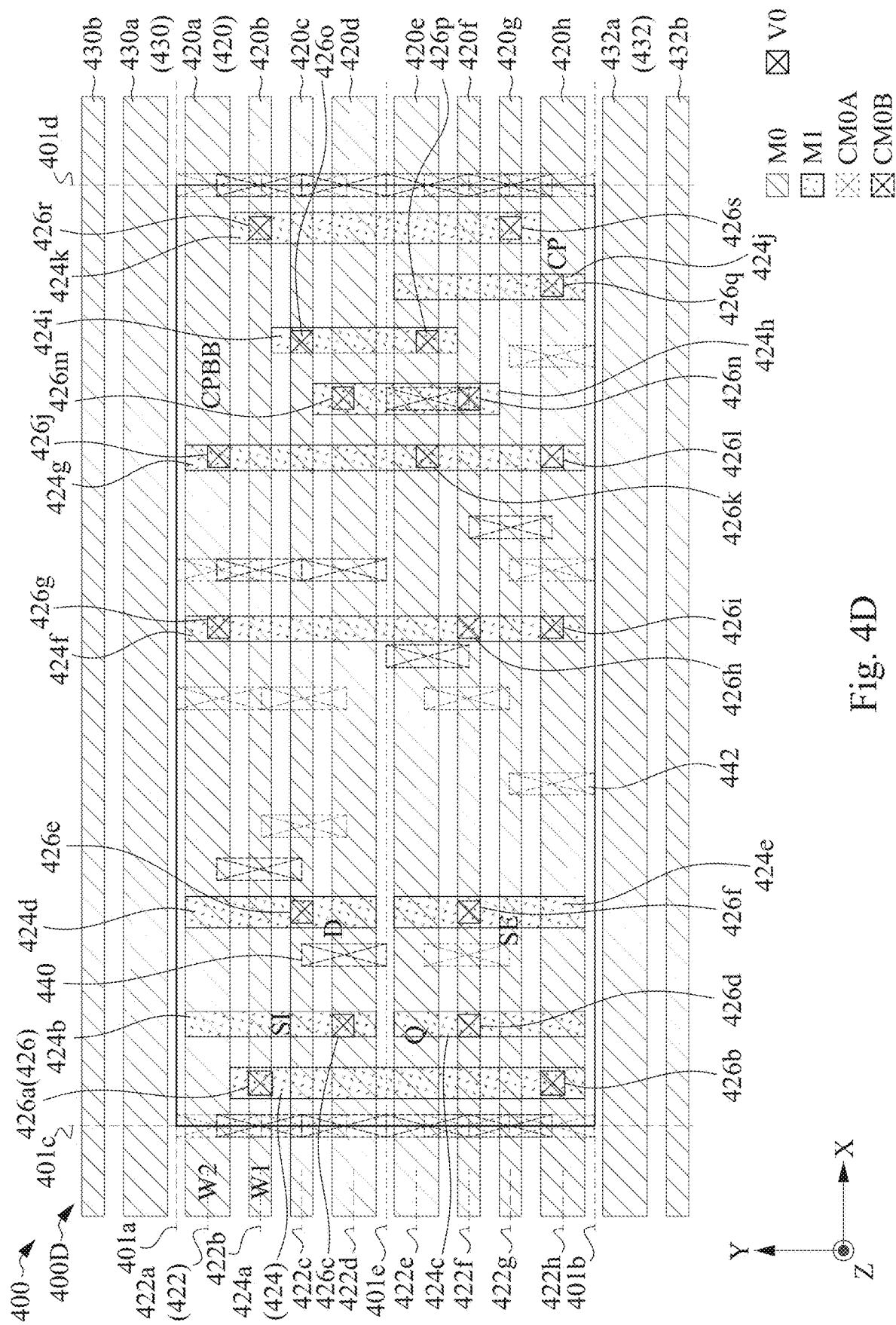
Figure 4E:
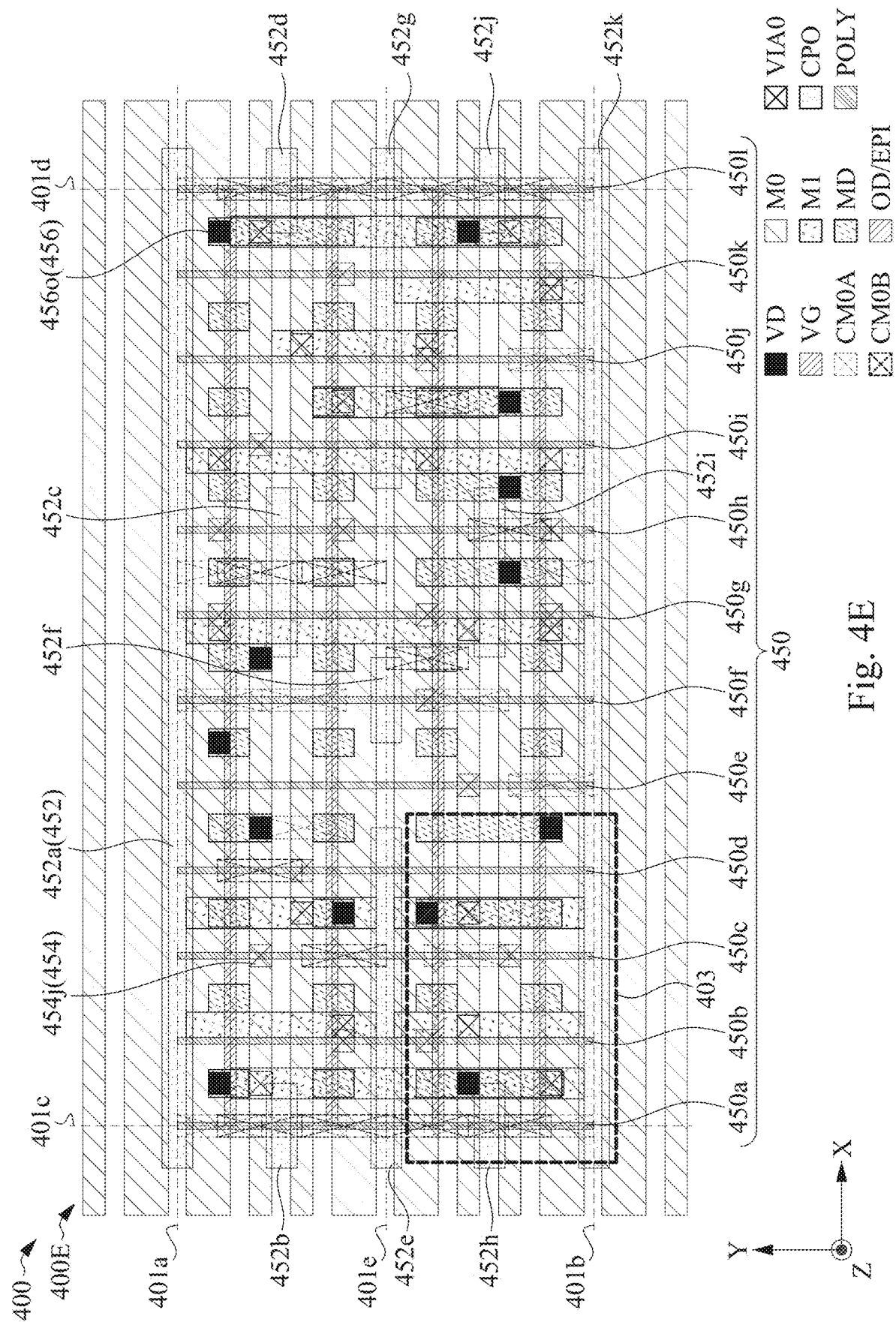

In some embodiments, the set of cut feature layout patterns 440 have a first color (e.g., color B) and the set of cut feature layout patterns 442 have a second color (e.g., color A). The color (e.g., color A and color B) indicates that features with the same color are to be formed on a same mask of a multiple mask set, and features with a different color are to be formed on a different mask of the multiple mask set. Two colors are depicted in FIG. 4D as an example. In some embodiments, there are more or less than two colors in layout design 400.

Other configurations, arrangements on other layout levels or quantities of patterns in the set of cut feature layout patterns 440 are within the scope of the present disclosure. In some embodiments, at least one cut feature layout pattern of the set of cut feature layout patterns 440 or 442 is not included in layout design 400.

Layout design 400 further includes one or more gate layout patterns 450a, 450b, 450c, . . . , 450l (collectively referred to as a "set of gate layout patterns 450") extending in the second direction Y. Each of the gate layout patterns of the set of gate layout patterns 450 is separated from an adjacent gate layout pattern of the set of gate layout patterns 450 in the first direction X by a first pitch (not shown).

The set of gate layout patterns 450 is usable to manufacture a corresponding set of gates 550 (FIGS. 5A-5E) of integrated circuit 500. In some embodiments, gate layout patterns 450a, 450b, 450c, . . . , 450l of the set of gate layout patterns 450 is usable to manufacture corresponding gates 550a, 550b, 550c, . . . , 550l of the set of gates 550 (FIGS. 5A-5E) of integrated circuit 500.

In some embodiments, at least a portion of gate layout pattern 450a, 450b, 450c, . . . , 450l of the set of gate layout patterns 450 is usable to manufacture gates of NMOS transistors of integrated circuit 300B, 500, 600B or 700B (FIG. 3B, 5, 6B or 7B), and at least a portion of gate layout pattern 450a, 450b, 450c, . . . , 450l of the set of gate layout patterns 450 is usable to manufacture gates of PMOS transistors of integrated circuit 300B, 500, 600B or 700B (FIG. 3B, 6B or 7B). In some embodiments, the gate layout patterns correspond to other transistors in integrated circuit 300B.

The set of gate layout patterns 450 is above the set of active region layout patterns 402, the set of power rail layout patterns 404 and the set of via layout patterns 406. The set of gate layout patterns 450 is positioned on a sixth layout level (POLY) different from the first layout level, the second layout level, the third layout level, and the fourth layout level. In some embodiments, the fifth layout level is above the first layout level and the second layout level. In some embodiments, the sixth layout level is the same as the fifth layout level. In some embodiments, the sixth layout level is different from the fifth layout level.

In some embodiments, the sixth layout level corresponds to the POLY level of one or more of layout designs 400, 600A or 700A (FIGS. 4A-4D, 6A or 7A) or integrated circuit 500, 600B or 700B (FIG. 5, 6B or 7B).

Other configurations, arrangements on other layout levels or quantities of patterns in the set of gate layout patterns 450 are within the scope of the present disclosure.

Layout design 400 further includes one or more via layout patterns 454a (not labelled), 454b, 454c, . . . , 454q (collectively referred to as a "set of via layout patterns 454"). For ease of illustration, one or more via layout patterns of the set of via layout patterns 454 are not labelled. The set of via patterns 454 is positioned at a via over gate (VG) level of one or more of layout designs 400, 600A or 700A (FIGS. 4A-4D, 6A or 7A) or integrated circuit 500, 600B or 700B (FIG. 5, 6B or 7B). In some embodiments, the VG level is between the POLY level and the M0 level. In some embodiments, the VG level is between the sixth layout level and at least the third layout level. In some embodiments, at least one via layout pattern of the set of via patterns 454 is not included in layout design 400. Other layout levels are within the scope of the present disclosure.

Other configurations, arrangements on other layout levels or quantities of patterns in the set of via patterns 454 are within the scope of the present disclosure.

Layout design 400 further includes one or more cut feature layout patterns 452a, 452b, . . . , 452g or 452k (collectively referred to as a "set of cut feature layout patterns 452"). The set of cut feature layout patterns 452 extend in the first direction X. In some embodiments, each cut feature layout pattern 452a, 452b, . . . , 452g or 452k of the set of cut feature layout patterns 452 is separated from an adjacent cut feature layout pattern in at least the first direction X or the second direction Y. The set of cut feature layout patterns 452 is located on the sixth layout level.

In some embodiments, the set of cut feature layout patterns 452 overlap at least a portion of a layout pattern of the set of gate layout patterns 450. In some embodiments, the set of cut feature layout patterns 452 overlap other underlying layout patterns (not shown) of other layout levels (e.g., BPR, Active, MD, or the like) of layout design 400.

In some embodiments, cut feature layout patterns 452a, 452b, . . . , 452g or 452k identify corresponding locations of corresponding portions (not labelled) of the set of gates 550 in integrated circuit 500 that are removed by a cut poly process. In some embodiments, the cut poly process is similar to the cut metal process in operation 806 of method 800 (FIG. 8), and similar detailed description is omitted.

Other configurations, arrangements on other layout levels or quantities of patterns in the set of cut feature layout patterns 452 are within the scope of the present disclosure. In some embodiments, at least one cut feature layout pattern of the set of cut feature layout patterns 452 is not included in layout design 400.

Other configurations, arrangements on other layout levels or quantities of patterns in layout design 400 are within the scope of the present disclosure.

FIGS. 5A-5E are diagrams of an integrated circuit 500, in accordance with some embodiments.

Integrated circuit 500 is manufactured by layout design 400. Integrated circuit 500 is an embodiment of integrated circuit 300A of FIG. 3A or integrated circuit 300B of FIG. 3B.

Structural relationships including alignment, lengths and widths, as well as configurations and layers of integrated circuit 500 are similar to the structural relationships and configurations and layers of layout design 400 of FIGS. 4A-4D, and similar detailed description will not be described in FIGS. 5A-5E, 6B-6C and 7B for brevity.

FIGS. 5A-5B and 5D-5E are corresponding top views of integrated circuit 500, in accordance with some embodiments. FIG. 5C is a cross-sectional view of integrated circuit 500, in accordance with some embodiments. FIG. 5C is a cross-sectional view of integrated circuit 500 as intersected by plane A-A', in accordance with some embodiments. In some embodiments, FIG. 5C is a cross-sectional view of integrated circuit 500 corresponding to layout design 400 as intersected by plane A-A', in accordance with some embodiments. FIGS. 5A-5E are diagrams of a corresponding portion 500A-500E of integrated circuit 500 of FIG. 5A, simplified for ease of illustration.

Portion 500A includes one or more features of integrated circuit 500 of FIG. 5A of the OD/EPI level, POLY level, MD level, VD level, VG level, M0 level, V0 level, and M1 level of integrated circuit 500. Portion 500B includes one or more features of integrated circuit 500 of FIG. of the BPR level and the OD/BPR level of integrated circuit 500.

Portion 500C includes one or more features of integrated circuit 500 of FIG. 5A of the BPR level, VB level, OD level, POLY level, the MD level and the M0 level of integrated circuit 500. Portion 500D includes one or more features of integrated circuit 500 of FIG. 5A of the M0 level, CM0A level, CM0B level. V0 level, and M1 level of integrated circuit 500. Portion 500E includes one or more features of integrated circuit 500 of FIG. 5A of the OD/EPI level, POLY level, MD level, VD level, VG level, M0 level, V0 level, and M1 level of integrated circuit 500. Portion 500E of FIG. 5E corresponds to portion 500A of FIG. 5A, but portion 500A and 500E include different labels for ease of illustration. For example, portion 500A identifies each of the locations of the PMOS and NMOS transistors from integrated circuit 300B, and similar detailed description is omitted. For example, portion 500E does not identify the locations of the PMOS and NMOS transistors from integrated circuit 300B for ease of illustration, but portion 400E includes labels for each of the set of gates 550, and similar detailed description is omitted.

Integrated circuit 500 includes at least the set of active regions 502, the set of power rails 504, set of via layout patterns 506, set of contacts 508, set of contacts 509, the set of conductive structures 520, the set of conductive structures 524 or the set of vias 526, set of gate layout patterns 550, set of vias 554 and set of vias 556.

In some embodiments, at least active region 502a or 502d of the set of active regions correspond to source and drain regions of NMOS transistors of integrated circuits 300A-300B, and at least active regions 502b or 502c of the set of active regions 502 correspond to source and drain regions of PMOS transistors of integrated circuits 300A-300B. For example, in these embodiments, at least active region 502a or 502d of the set of active regions 502 correspond to source and drain regions of one or more of NMOS transistors N1, N2, N3, N4, N5, N6, N7, N8, N9, N10, N11, N12, N13, N14, N15 or N16, and at least active region 502b or 502c of the set of active regions 502 correspond to source and drain regions of PMOS transistors P1, P2, P3, P4, P5, P6, P7, P8, P9, P10, P11, P12, P13, P14, P15 or P16.

In some embodiments, at least active region 502a or 502d of the set of active regions 502 corresponds to source and drain regions of PMOS transistors of integrated circuits 300A-300B, and at least active region 502b or 502c of the set of active regions 502 corresponds to source and drain regions of NMOS transistors of integrated circuits 300A-300B. For example, in these embodiments, at least active region 502a or 502d of the set of active regions 502 corresponds to source and drain regions of one or more of PMOS transistors P1, P2, P3, P4, P5, P6, P7, P8, P9, P10, P11, P12, P13, P14, P15 or P16, and at least active region 502b or 502c of the set of active regions 502 corresponds to source and drain regions of NMOS transistors N1, N2, N3, N4, N5, N6, N7, N8, N9, N10, N11, N12, N13, N14, N15 or N16. The set of active regions 502 are electrically isolated from each other by a set of isolation structures 503. Each of active region 502c and active region 502d are electrically isolated from each other by isolation structure 503b. In some embodiments, the set of isolation structures 503 are an epitaxial structure. In some embodiments, the set of isolation structures 503 include an oxide, or a nitride of a high-k dielectric. Other configurations, arrangements on other layout levels or quantities of patterns in the set of active regions 502 are within the scope of the present disclosure.

In some embodiments, the set of active regions 502 are located on a front-side of integrated circuit 500. In some embodiments, the set of power rails 504 are located on a back-side of integrated circuit 500. The front-side of integrated circuit 500 is opposite from the back-side of integrated circuit 500 in the second direction Y. In some embodiments, by positioning the set of power rails 504 on the back-side of integrated circuit 500, results in integrated circuit 500 occupying less area than other approaches.

Other configurations, arrangements on other layout levels or quantities of patterns in the set of power rails 504 are within the scope of the present disclosure.

Power rail 504b is configured to supply a supply voltage VDD, and power rails 504a and 504c are configured to supply reference supply voltage VSS. The set of vias 506 is configured to electrically couple the set of power rails 504 to the set of active regions 502. Via 506b is between power rail 504b and active region 502c. In some embodiments, via 506b is between power rail 504b and contact 508b. Via 506c is between power rail 504c and active region 502d. In some embodiments, via 506c is between power rail 504c and contact 508c. Other configurations, arrangements on other levels or quantities in the set of vias 506 are within the scope of the present disclosure.

Set of contacts 508 and 509 correspond to contacts of PMOS and NMOS transistors in integrated circuit 300B of FIG. 3B. For ease of illustration, one or more contacts of the set of contacts 508 or 509 are not labelled.

In some embodiments, at least one contact 508a, 508b, 508c, . . . , 508o of the set of contacts 508 corresponds to source or drain terminals of one of the NMOS or PMOS transistors of integrated circuit 300B, and at least one contact 509a, 509b, 509c, . . . , 509u of the set of contacts 509 corresponds to source or drain terminals of one of the NMOS or PMOS transistors of integrated circuit 300B. Other configurations, arrangements on other levels or quantities of patterns in the set of contacts 508 are within the scope of the present disclosure.

Set of vias 556 is configured to electrically couple the set of active regions 502 to the set of contacts 508 and 509. For ease of illustration, one or more vias of the set of vias 556 are not labelled. Other configurations, arrangements on other levels or quantities in the set of vias 556 are within the scope of the present disclosure.

The set of conductive structures 520 include one or more of conductive structures 520a, 520b, 520c, 520d, 520e, 520f, 520g or 520h. The set of conductive structures 520 overlaps at least one power rail of the set of power rails 504.

In some embodiments, the set of conductive structures 520 overlaps other underlying structures (not shown) of other levels (e.g., Active, MD, POLY or the like) of integrated circuit 500.

At least conductive structure 520b, 520c, 520f or 520g of the set of conductive structures 520 has a width W1' in the second direction Y. At least conductive structure 520a, 520d, 520e or 520h of the set of conductive structures 520 has a width W2' in the second direction Y. Width W2' is different from width W1'. In some embodiments, width W2' is the same as width W1'.

Other widths for the set of conductive structures 520 is within the scope of the present disclosure. In some embodiments, at least conductive structure 520b, 520c, 520f or 520g of the set of conductive structures 520 has width W2' in the second direction Y. In some embodiments, at least conductive structure 520a, 520d, 520e or 520h of the set of conductive structures 520 has width W1' in the second direction Y.

In some embodiments, conductive structures 520a, 520b, 520c, 520d, 520e, 520f, 520g, 520h of the set of conductive structures 520 correspond to 8 M0 routing tracks in integrated circuit 500. Other numbers of M0 routing tracks are within the scope of the present disclosure. In some embodiments, as the number of M0 tracks are increased, the number of conductive structures of the set of conductive structures 520 having width W2' is decreased to maintain sufficient separation between adjacent conductive structures of the set of conductive structures 520 to satisfy minimum spacing requirements that ensure sufficient manufacturing yield that overcomes manufacturing variations. In some embodiments, as the number of M0 tracks are decreased, the number of conductive structures of the set of conductive structures 520 having width W2' is increased while maintaining sufficient separation between adjacent conductive structures of the set of conductive structures 520 to satisfy minimum spacing requirements that ensure sufficient manufacturing yield that overcomes manufacturing variations.

In some embodiments, integrated circuit 500 further includes at least set of conductive structures 530 or the set of conductive structures 532. The set of conductive structures 530 includes one or more of conductive structures 530a or 530b. The set of conductive structures 532 includes one or more of conductive structures 532a or 532b. In some embodiments, the set of conductive structures 530 and 532 are similar to the set of conductive structures 520, and similar detailed description is therefore omitted.

In some embodiments, at least one conductive structure of the set of conductive structures 520, 524, 530 or 532 or at least one power rail set of power rails 504 includes one or more layers of a conductive material. In some embodiments, the conductive material includes Tungsten, Cobalt, Ruthenium, Copper, or the like or combinations thereof.

In some embodiments, the set of conductive structures 530 and 532 are part of corresponding integrated circuits (similar to integrated circuit 500) that abut integrated circuit 500 along corresponding cell boundaries 501a and 501b. In some embodiments, conductive structures 520a and 530a are offset in the second direction Y from cell boundary 501a, and are referred to as "sharing space." In some embodiments, conductive structures 520h and 532a are offset in the second direction Y from cell boundary 501a, and are referred to as "sharing space."

Figure 6C:
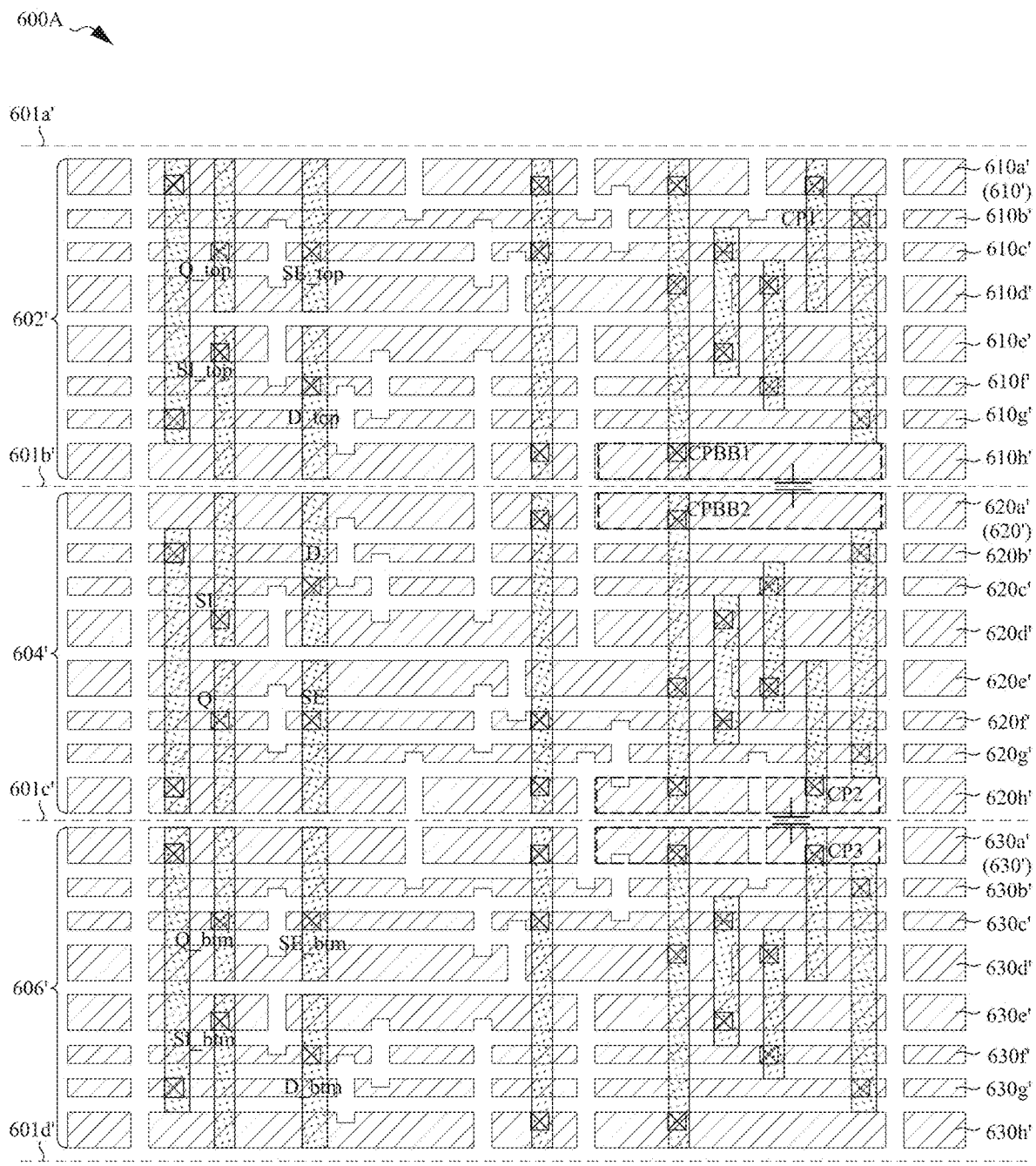
FIG. 6C is a top view of an integrated circuit, in accordance with some embodiments.
Figure 6C:
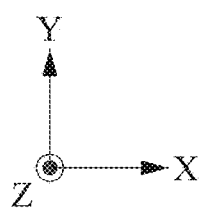

In some embodiments, as the width W1' or W2' is increased, the corresponding resistance of the corresponding conductive structure of the set of conductive structures 520 is decreased, and vice versa. However, in some embodiments, as the width W1' or W2' is increased, the corresponding coupling capacitance between corresponding conductive structures of the set of conductive structures 520 also increases. In some embodiments, by positioning conductive structures 520a and 520h of the set of conductive structures 520 to be offset from corresponding cell boundaries 501a and 501b, causes conductive structures 520b, 520c, 520d, 520e, 520f and 520g of the set of conductive structures 520 to be shifted in the second direction Y from cell boundary 501b compared with other approaches, thereby causing additional distance between similar corresponding conductive structures of abutting integrated circuits (e.g., as shown in FIGS. 6B-6C & 7B), resulting in less coupling capacitance between the set of conductive structures 520 than other approaches. In some embodiments, by reducing the coupling capacitance of the set of conductive structures 520 results in integrated circuit 500 consuming less power than other approaches.

The set of gates 550 corresponds to the gates of PMOS transistors and NMOS transistors of integrated circuit 300B of FIG. 3B.

Gate 550b corresponds to the gates of each of PMOS transistors P7 and P13 and NMOS transistors N7 and N13. A portion of gate 550b corresponds to the gate of PMOS transistor P7 and NMOS transistor N7, and another portion of gate 550b corresponds to the gate of PMOS transistor P13 and NMOS transistor N13.

Gate 550c corresponds to the gates of each of PMOS transistors P8 and P12 and NMOS transistors N8 and N12. A portion of gate 550c corresponds to the gate of PMOS transistor P8 and NMOS transistor N8, and another portion of gate 550c corresponds to the gate of PMOS transistor P12 and NMOS transistor N12.

Gate 550d corresponds to the gates of PMOS transistor P10 and NMOS transistor N10.

Gate 550e corresponds to the gates of each of PMOS transistors P9 and P16 and NMOS transistors N9 and N16. A portion of gate 550e corresponds to the gate of PMOS transistor P9 and NMOS transistor N9, and another portion of gate 550e corresponds to the gate of PMOS transistor P16 and NMOS transistor N16.

Gate 550f corresponds to the gates of PMOS transistor P6 and NMOS transistor N6.

Gate 550g corresponds to the gates of each of PMOS transistors P1 and P5 and NMOS transistors N1 and N5. A portion of gate 550g corresponds to the gate of PMOS transistors P1 and P5, another portion of gate 550g corresponds to the gate of NMOS transistor N1, and yet another portion of gate 550g corresponds to the gate of NMOS transistor N5.

Gate 550h corresponds to the gates of each of PMOS transistors P3 and P4 and NMOS transistors N3 and N4. A portion of gate 550h corresponds to the gate of PMOS transistors P3 and P4, another portion of gate 550h corresponds to the gate of NMOS transistor N3, and yet another portion of gate 550h corresponds to the gate of NMOS transistor N4.

Gate 550i corresponds to the gates of PMOS transistor P2 and NMOS transistor N2.

Gate 550j corresponds to the gates of PMOS transistor P11 and NMOS transistor N11.

Gate 550k corresponds to the gates of each of PMOS transistors P14 and P15 and NMOS transistors N14 and N15. A portion of gate 550k corresponds to the gate of PMOS transistor P14 and NMOS transistor N14, and another portion of gate 550k corresponds to the gate of PMOS transistor P15 and NMOS transistor N15.

Other configurations, arrangements on other levels or quantities in the set of gates 550 are within the scope of the present disclosure.

The set of vias 554 electrically couple the set of gates 550 and the set of conductive structures 520 to each other. For ease of illustration, one or more vias of the set of vias 554 are not labelled. Other configurations, arrangements on other levels or quantities in the set of vias 554 are within the scope of the present disclosure.

Other configurations, arrangements on other layout levels or quantities of patterns in integrated circuit 500 are within the scope of the present disclosure.

FIG. 6A is a diagram of a layout design 600A of an integrated circuit, in accordance with some embodiments. Layout design 600A is a layout diagram of integrated circuit 100 of FIG. 1 or integrated circuit 200 of FIG. 2. For ease of illustration, some of the labeled elements of FIG. 6A are not labelled in FIGS. 6B-6C.

Layout design 600A includes layout designs 602, 604 and 606. In some embodiments, layout design 600A includes additional elements not shown in FIG. 6A.

In some embodiments, each of layout designs 602, 604 and 606 corresponds to layout design 400, and similar detailed description is therefore omitted. In some embodiments, layout design 602 is a layout design of flip-flop 102 of FIG. 1, layout design 604 is a layout design of flip-flop 104, and layout design 604 is a layout design of flip-flop 106, and similar detailed description is therefore omitted. In some embodiments, layout design 602 is a layout design of flip-flop 202 of FIG. 2, layout design 604 is a layout design of flip-flop 204, and layout design 604 is a layout design of flip-flop 206, and similar detailed description is therefore omitted.

Each of layout designs 602, 604 and 606 extend in at least the first direction X. Each of layout designs 602, 604 and 606 are separated from another of layout designs 602, 604 and 606 in the second direction Y.

Layout design 602 has cell boundaries 601a and 601b that extend in the first direction X. In some embodiments, layout design 602 is adjacent in the first direction along cell boundary 601a to other layout designs (not shown for ease of illustration).

Layout design 602 is adjacent to layout design 604 in the first direction X along cell boundary 601b. Layout design 604 is adjacent to layout design 606 in the first direction X along a cell boundary 601c. Layout design 606 is adjacent to other layout designs (not shown for ease of illustration) in the first direction X along cell boundary 601d.

In some embodiments, one of layout designs 602, 604 or 606 is a different layout design from another of layout designs 602, 604 or 606. Each of layout designs 602, 604 and 606 have a height H1 in the second direction Y. In some embodiments, layout design 602 and 604 are mirror images of each other with respect to cell boundary 601b. In some embodiments, layout design 604 and 606 are mirror images of each other with respect to cell boundary 601c.

In some embodiments, each of layout designs 602, 604 and 606 corresponds to layout design 400, and similar detailed description is therefore omitted.

In some embodiments, in comparison with layout design 400, conductive feature layout patterns 620a, 620b, 620c, 620d, 620e, 620f, 620g, 620h of the set of conductive feature layout patterns 620 of layout design 604 replace corresponding conductive feature layout patterns 420a, 420b, 420c, 420d, 420e, 420f, 420g, 420h of the set of conductive feature layout patterns 420, and similar detailed description is therefore omitted.

In some embodiments, layout design 602 is a mirror image of layout design 400 with respect to the first direction X. In some embodiments, in comparison with layout design 400, conductive feature layout patterns 610a, 610b, 610c, 610d, 610e, 610f, 610g, 610h of the set of conductive feature layout patterns 610 of layout design 602 replace corresponding conductive feature layout patterns 420a, 420b, 420c, 420d, 420e, 420f, 420g, 420h of the set of conductive feature layout patterns 420, and similar detailed description is therefore omitted.

In some embodiments, layout design 606 is a mirror image of layout design 400 with respect to the first direction X. In some embodiments, in comparison with layout design 400, conductive feature layout patterns 630a, 630b, 630c, 630d, 630e, 630f, 630g, 630h of the set of conductive feature layout patterns 630 of layout design 606 replace corresponding conductive feature layout patterns 420a, 420b, 420c, 420d, 420e, 420f, 420g, 420h of the set of conductive feature layout patterns 420, and similar detailed description is therefore omitted.

In some embodiments, at least conductive feature layout pattern 610b, 620g or 630b is a layout pattern of the input pin of inverter 310 of FIG. 3B. In some embodiments, at least conductive feature layout pattern 610h, 620a or 630h is a layout pattern of the output pin of inverter 312 of FIG. 3B.

In some embodiments, at least conductive feature layout pattern 610b, 620g or 630b is a layout pattern of corresponding input pin of inverter 650a, 650b and 650c of FIG. 6B. In some embodiments, at least conductive feature layout pattern 610h, 620a or 630h is a layout pattern of corresponding output pin of inverter 652a, 652b and 652c of FIG. 6B In some embodiments, by positioning conductive feature layout patterns 620h and 630a to be offset from cell boundary 601c, causes a distance between conductive feature layout patterns 620h and 630a in the second direction Y to be increased compared with other approaches. In some embodiments, by increasing the distance between conductive feature layout patterns 620h and 630a in the second direction Y results in less coupled capacitance between conductive structures 620h' (FIG. 6C) and 630a' manufactured by corresponding conductive feature layout patterns 620h and 630a than other approaches.

In some embodiments, by positioning conductive feature layout patterns 610h and 620a to be offset from cell boundary 601b, causes a distance between conductive feature layout patterns 610h and 620a in the second direction Y to be increased compared with other approaches. In some embodiments, by increasing the distance between conductive feature layout patterns 610h and 620a in the second direction Y results in less coupled capacitance between conductive structures 610h' (FIG. 6C) and 620a' manufactured by corresponding conductive feature layout patterns 610h and 620a than other approaches.

Other configurations or quantities of layout designs 602, 604 and 606 are within the scope of the present disclosure. For example, layout design 600A of FIG. 6A includes one column (Column 1) and three rows (Rows 1-3) of cells (e.g., layout designs 602, 604 and 606). Other numbers of rows and/or columns in layout design 600A are within the scope of the present disclosure.

For example, in some embodiments, layout design 600A includes at least an additional column of cells, similar to column 1, and being adjacent to column 1. For example, in some embodiments, layout design 600A includes at least an additional row of cells, similar to row 2, adjacent to row 1 along cell boundary 601a. For example, in some embodiments, layout design 600A includes at least an additional row of cells, similar to row 2, adjacent to row 3 along corresponding cell boundary 601d. In some embodiments, layout design 602 or 606 alternates with standard cell layout design 604 in the second direction Y.

FIG. 6B is a schematic view of a diagram of an integrated circuit 600B, in accordance with some embodiments.

Integrated circuit 600B includes regions 602', 604' and 606'. In some embodiments, each region 602', 604' and 606' corresponds to integrated circuit 300B of FIG. 3B, and similar detailed description is therefore omitted.

In some embodiments, integrated circuit 600B is manufactured by layout design 600A, and similar detailed description is therefore omitted. In some embodiments, regions 602', 604' and 606' are manufactured by corresponding layout designs 602, 604 and 606 of FIG. 6A, and similar detailed description is therefore omitted.

In some embodiments, each boundary 601a', 601b', 601c' and 601d' corresponds to cell boundary 601a, 601b, 601c and 601d of layout design 600A, and similar detailed description is therefore omitted.

Each region 602', 604' and 606' includes a corresponding inverter 650a, 650b and 650c and a corresponding inverter 652a, 652b and 652c. Each of inverter 650a, 650b and 650c is similar to inverter 310 of FIG. 3B, and each of inverter 652a, 652b and 652c is similar to inverter 310 of FIG. 3B, and similar detailed description is therefore omitted.

In some embodiments, each of an output pin of inverter 652a, 652b and 652c are coupled together. In some embodiments, the output pin of inverter 652a and the output pin of inverter 650b have a coupling capacitance C1.

In some embodiments, each of an input pin of inverter 650a, 650b and 650c are coupled together. In some embodiments, the input pin of inverter 650b and the input pin of inverter 650c have a coupling capacitance C2.

FIG. 6C is a top view of an integrated circuit 600B, in accordance with some embodiments.

Integrated circuit 600B is manufactured by layout design 600A.

Integrated circuit 600B is an embodiment of integrated circuit 100 of FIG. 1 or integrated circuit 200 of FIG. 2.

In some embodiments, each region 602', 604' and 606' corresponds to integrated circuit 500, and similar detailed description is therefore omitted. In some embodiments, region 602' is an embodiment of flip-flop 102 of FIG. 1, region 604' is an embodiment of flip-flop 104, and region 606' is an embodiment of flip-flop 106, and similar detailed description is therefore omitted. In some embodiments, region 602' is an embodiment of flip-flop 202 of FIG. 2, region 604' is an embodiment of flip-flop 204, and region 606' is an embodiment of flip-flop 206, and similar detailed description is therefore omitted.

In some embodiments, in comparison with integrated circuit 500, conductive structures 620a', 620b', 620c', 620d', 620e', 620l, 620g', 620h' of the set of conductive structures 620' of region 604' replace corresponding conductive structures 520a, 520b, 520c, 520d, 520e, 520f, 520g, 520h of the set of conductive structures 520, and similar detailed description is therefore omitted.

In some embodiments, region 602' is a mirror image of integrated circuit 500 with respect to the first direction X. In some embodiments, in comparison with integrated circuit 500, conductive structures 610a', 610b', 610c', 610d', 610e', 610l, 610g', 610h' of the set of conductive structures 610' of region 602' replace corresponding conductive structures 520a, 520b, 520c, 520d, 520e, 520f, 520g, 520h of the set of conductive structures 520, and similar detailed description is therefore omitted.

In some embodiments, region 606' is a mirror image of integrated circuit 500 with respect to the first direction X. In some embodiments, in comparison with integrated circuit 500, conductive structures 630a', 630b', 630c', 630d', 630e', 630l, 630g', 630h' of the set of conductive structures 630' of region 606' replace corresponding conductive structures 520a, 520b, 520c, 520d, 520e, 520f, 520g, 520h of the set of conductive structures 520, and similar detailed description is therefore omitted.

In some embodiments, at least conductive structure 610b', 620g' or 630b' is the corresponding input pin of inverter 650a, 650b and 650c of FIG. 6B. In some embodiments, at least conductive structure 610h', 620a' or 630h' is the corresponding output pin of inverter 652a, 652b and 652c of FIG. 6B.

In some embodiments, the output pin of inverter 652a and the output pin of inverter 650b have a coupling capacitance C1.

In some embodiments, the input pin of inverter 650b and the input pin of inverter 650c have a coupling capacitance C2.

In some embodiments, by positioning conductive structures 620h' and 630a' to be offset from boundary 601c', causes a distance between conductive structures 620h' and 630a' in the second direction Y to be increased compared with other approaches. In some embodiments, by increasing the distance between conductive structures 620h' and 630a' in the second direction Y results in less coupled capacitance C2 between conductive structures 620h' and 630a' than other approaches for the same clock slew.

In some embodiments, by positioning conductive structures 610h' and 620a' to be offset from boundary 601b', causes a distance between conductive structures 610h' and 620a' in the second direction Y to be increased compared with other approaches. In some embodiments, by increasing the distance between conductive structures 610h' and 620a' in the second direction Y results in less coupled capacitance C1 between conductive structures 610h' and 620a' than other approaches for the same clock slew. In some embodiments, by reducing the coupling capacitance C 1 and C2 results in integrated circuit 600B consuming less power than other approaches.

In some embodiments, by reducing the coupling capacitance C 1 and C2 results in integrated circuit 600B consuming less power than other approaches.

Other configurations or quantities of regions 602', 604' and 606' are within the scope of the present disclosure. For example, integrated circuit 600B of FIG. 6C includes one column (Column 1) and three rows (Rows 1-3) of cells (e.g., regions 602', 604' and 606'). Other numbers of rows and/or columns in integrated circuit 600B are within the scope of the present disclosure.

FIG. 7A is a diagram of a layout design 700A of an integrated circuit, in accordance with some embodiments. Layout design 700A is a layout diagram of integrated circuit 100 of FIG. 1 or integrated circuit 200 of FIG. 2. For ease of illustration, some of the labeled elements of FIG. 7A are not labelled in FIG. 7B.

Layout design 700A is a variation of layout design 600A, and similar detailed description is omitted. For example, layout design 700A illustrates an example where a set of conductive feature layout patterns 710, 720, 730 replace corresponding set of conductive feature layout patterns 610, 620, 630 of FIG. 6A, causing layout design 700A to have more M0 routing tracks than layout design 600A.

In comparison with layout design 600A, conductive feature layout patterns 710a, 710d, 710e, 710h, 720a, 720d, 720e, 720h, 730a, 730d, 730e, 730h replace corresponding conductive feature layout patterns 610a, 610d, 610e, 610h, 620a, 620d, 620e, 620h, 630a, 630d, 630e, 630h, and similar detailed description is therefore omitted.

Set of conductive feature layout patterns 720 includes one or more of conductive feature layout patterns 720a, 620b, 620c, 720d, 720e, 620f, 620g, 720h or 720i.

Set of conductive feature layout patterns 710 includes one or more of conductive feature layout patterns 710a, 610b, 610c, 710d, 710e, 610f, 610g, 710h or 710i.

Set of conductive feature layout patterns 730 includes one or more of conductive feature layout patterns 730a, 710b, 710c, 730d, 730e, 710f, 710g, 730h or 730i.

In comparison with layout design 600A, each of conductive feature layout patterns 710a, 710d, 710e, 710h, 720a, 720d, 720e, 720h, 730a, 730d, 730e, 730h have widths W1 instead of widths W2, and similar detailed description is therefore omitted.

Conductive feature layout pattern 720i is positioned between conductive feature layout patterns 720d and 720e. Conductive feature layout pattern 710i is positioned between conductive feature layout patterns 710d and 710e. Conductive feature layout pattern 730i is positioned between conductive feature layout patterns 730d and 730e.

In some embodiments, by changing the widths of each of conductive feature layout patterns 720a, 720d, 720e, 720h, the set of conductive feature layout patterns 720 has 9 M0 routing tracks compared with 8 M0 routing tracks shown in FIG. 6A.

In some embodiments, by changing the widths of each of conductive feature layout patterns 710a, 710d, 710e, 710h, the set of conductive feature layout patterns 710 has 9 M0 routing tracks compared with 8 M0 routing tracks shown in FIG. 6A.

In some embodiments, by changing the widths of each of conductive feature layout patterns 730a, 730d, 730e, 730h, the set of conductive feature layout patterns 730 has 9 M0 routing tracks compared with 8 M0 routing tracks shown in FIG. 6A.

Other configurations, arrangements on other layout levels or quantities of patterns in the set of conductive feature layout patterns 710, 720 or 730 are within the scope of the present disclosure. Other configurations or quantities of layout patterns in layout design 700A are within the scope of the present disclosure.

In some embodiments, by positioning conductive feature layout patterns 720h and 730a to be offset from cell boundary 601c, causes a distance between conductive feature layout patterns 720h and 730a in the second direction Y to be increased compared with other approaches. In some embodiments, by increasing the distance between conductive feature layout patterns 720h and 730a in the second direction Y results in less coupled capacitance between conductive structures 720h' (FIG. 7B) and 730a' manufactured by corresponding conductive feature layout patterns 720h and 730a than other approaches.

In some embodiments, by positioning conductive feature layout patterns 710h and 720a to be offset from cell boundary 601b, causes a distance between conductive feature layout patterns 710h and 720a in the second direction Y to be increased compared with other approaches. In some embodiments, by increasing the distance between conductive feature layout patterns 710h and 720a in the second direction Y results in less coupled capacitance between conductive structures 710h' (FIG. 7B) and 720a' manufactured by corresponding conductive feature layout patterns 710h and 720a than other approaches.

FIG. 7B is a top view of an integrated circuit 700B, in accordance with some embodiments.

Integrated circuit 700B is manufactured by layout design 700A.

Integrated circuit 700B is an embodiment of integrated circuit 100 of FIG. 1 or integrated circuit 200 of FIG. 2.

Integrated circuit 700B is a variation of integrated circuit 600C, and similar detailed description is omitted. For example, integrated circuit 700B illustrates an example where a set of conductive structures 710', 720', 730' replace corresponding set of conductive structures 610', 620', 630' of FIG. 6C, causing integrated circuit 700B to have more M0 routing tracks than integrated circuit 600C.

In comparison with integrated circuit 700B, conductive structures 710a', 710d', 710e', 710h', 720a', 720d', 720e', 720h', 730a', 730d', 730e', 730h' replace corresponding conductive structures 610a', 610d', 610e', 610h', 620a', 620d', 620e', 620h', 630a', 630d', 630e', 630h', and similar detailed description is therefore omitted.

Set of conductive structures 720' includes one or more of conductive structures 720a', 620b', 620c', 720d', 720e', 620f', 620g', 720h' or 720i'.

Set of conductive structures 710' includes one or more of conductive structures 710a', 610b', 610c', 710d', 710e', 610f', 610g', 710h' or 710i'.

Set of conductive structures 730' includes one or more of conductive structures 730a', 710b', 710c', 730d', 730e', 710f', 710g', 730h' or 730i'.

In comparison with integrated circuit 700B, each of conductive structures 710a, 710d, 710e, 710h, 720a, 720d, 720e, 720h, 730a, 730d, 730e, 730h have widths W1' instead of widths W2', and similar detailed description is therefore omitted.

Conductive structure 720i' is positioned between conductive structures 720d' and 720e'. Conductive structure 710i' is positioned between conductive structures 710d' and 710e'. Conductive structure 730i' is positioned between conductive structures 730d' and 730e'.

In some embodiments, by changing the widths of conductive structures 720a', 720d', 720e', 720h', the set of conductive structures 720' has 9 M0 routing tracks compared with 8 M0 routing tracks shown in FIG. 6C.

In some embodiments, by changing the widths of conductive structures 710a', 710d', 710e', 710h', the set of conductive structures 710' has 9 M0 routing tracks compared with 8 M0 routing tracks shown in FIG. 6C.

In some embodiments, by changing the widths of conductive structures 730a', 730d', 730e', 730h', the set of conductive structures 730' has 9 M0 routing tracks compared with 8 M0 routing tracks shown in FIG. 6C.

Other configurations, arrangements on other layout levels or quantities of patterns in the set of conductive structures 710', 720' or 730' are within the scope of the present disclosure. Other configurations or quantities of structures in integrated circuit 700B are within the scope of the present disclosure.

In some embodiments, by positioning conductive structures 720h' and 730a' to be offset from boundary 601c', causes a distance between conductive structures 720h' and 730a' in the second direction Y to be increased compared with other approaches. In some embodiments, by increasing the distance between conductive structures 720h' and 730a' in the second direction Y results in less coupled capacitance C2 between conductive structures 720h' and 730a' than other approaches for the same clock slew.

In some embodiments, by positioning conductive structures 710h' and 720a' to be offset from boundary 601b', causes a distance between conductive structures 710h' and 720a' in the second direction Y to be increased compared with other approaches. In some embodiments, by increasing the distance between conductive structures 710h' and 720a' in the second direction Y results in less coupled capacitance C1 between conductive structures 710h' and 720a' than other approaches for the same clock slew. In some embodiments, by reducing the coupling capacitance C1 and C2 results in integrated circuit 700B consuming less power than other approaches.

In some embodiments, by reducing the coupling capacitance C1 and C2 results in integrated circuit 700B consuming less power than other approaches.

FIG. 8 is a flowchart of a method 800 of forming or manufacturing an integrated circuit in accordance with some embodiments. It is understood that additional operations may be performed before, during, and/or after the method 800 depicted in FIG. 8, and that some other operations may only be briefly described herein. In some embodiments, the method 800 is usable to form integrated circuits, such as 100, 200, 300A-300B, 400A-400B, 500, 600B or 700B. In some embodiments, the method 800 is usable to form integrated circuits having similar structural relationships as one or more of layout design 400, 600A or 700A.

In operation 802 of method 800, a layout design of an integrated circuit is generated. Operation 802 is performed by a processing device (e.g., processor 1102 (FIG. 11)) configured to execute instructions for generating a layout design. In some embodiments, the layout design of method 800 includes one or more patterns of at least layout design 400, 600A or 700A. In some embodiments, the layout design of the present application is in a graphic database system (GDSII) file format.

In operation 804 of method 800, the integrated circuit is manufactured based on the layout design. In some embodiments, operation 804 of method 800 comprises manufacturing at least one mask based on the layout design, and manufacturing the integrated circuit based on the at least one mask.

In operation 806, one or more portions of conductive structures of the set of conductive structures is removed. In some embodiments, operation 806 includes forming the set of conductive structures 520 of integrated circuit 100, 200, 300A-300B, 400A-400B, 500, 600B or 700B. In some embodiments, cut feature layout patterns 440a, 440b, . . . , 440g or 440h and cut feature layout patterns 442a, 442b, . . . , 442i or 442j identify corresponding locations of corresponding portions (not labelled) of the set of conductive structures 520 that are removed.

In some embodiments, the removed portions of the set of conductive structures 520 corresponds to a cut region. In some embodiments, operation 806 is referred to as a cut-metal (CM0) process. In some embodiments, operation 806 is performed by a removal process. In some embodiments, the removal process includes one or more etching processes suitable to remove a portion of the set of conductive structures 520. In some embodiments, the etching process of operation 806 includes identifying portions of the set of conductive structures 520 that are to be removed, and etching the portions of the of the set of conductive structures 520 that are to be removed. In some embodiments, a mask is used to specify portions of the set of conductive structures 520 that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

Figure 9:
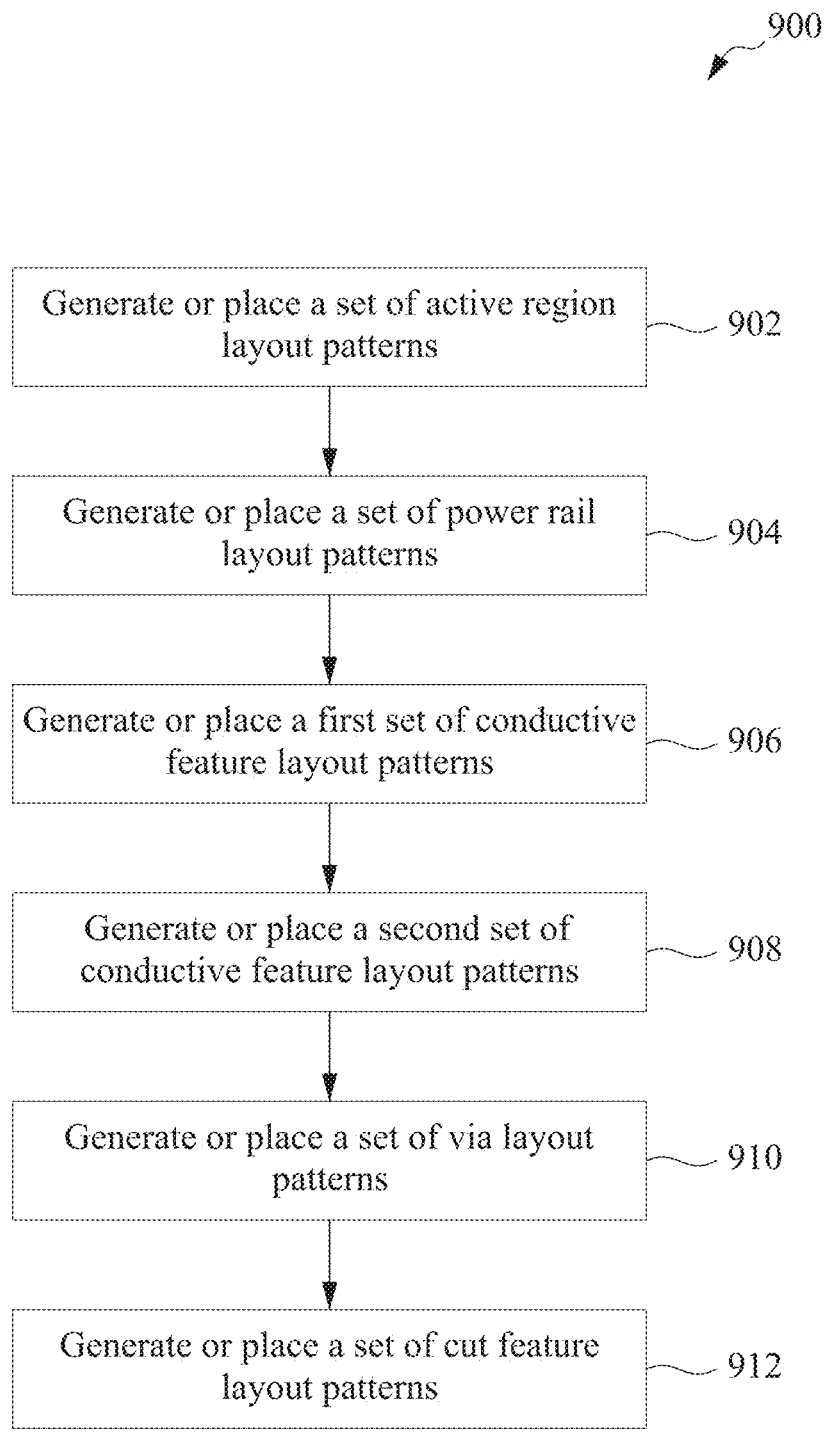
FIG. 9 is a flowchart of a method of generating a layout design of an integrated circuit in accordance with some embodiments.

FIG. 9 is a flowchart of a method 900 of generating a layout design of an integrated circuit in accordance with some embodiments. It is understood that additional operations may be performed before, during, and/or after the method 900 depicted in FIG. 9, and that some other processes may only be briefly described herein. Other order of operations for method 900 are within the scope of the present disclosure. In some embodiments, method 900 is an embodiment of operation 802 of method 800. In some embodiments, the method 900 is usable to generate one or more layout patterns of at least layout design 400, 600A or 700A of an integrated circuit such as integrated circuit 100, 200, 300A-300B, 400A-400B, 500, 600B or 700B).

In operation 902 of method 900, a set of active region layout patterns is generated or placed on a layout design. In some embodiments, the set of active region layout patterns of method 900 includes at least portions of one or more layout patterns of the set of active region layout patterns 402. In some embodiments, the layout design of method 900 includes one or more layout patterns of at least layout design 400, 600A or 700A.

In operation 904 of method 900, a set of power rail layout patterns is generated or placed on the layout design. In some embodiments, the set of power rail layout patterns of method 900 includes at least portions of one or more layout patterns of the set of set of power rail layout patterns 404.

In operation 906 of method 900, a first set of conductive feature layout patterns is generated or placed on the layout design. In some embodiments, the first set of conductive feature layout patterns of method 900 includes at least portions of one or more layout patterns of the set of conductive feature layout patterns 420, 430, 432, 610, 620, 630, 710, 720 or 730.

In operation 908 of method 900, a second set of conductive feature layout patterns is generated or placed on the layout design. In some embodiments, the second set of conductive feature layout patterns of method 900 includes at least portions of one or more layout patterns of the set of conductive feature layout patterns 424.

In operation 910 of method 900, a set of via layout patterns is generated or placed on the layout design. In some embodiments, the set of via layout patterns of method 900 includes at least portions of one or more layout patterns of the set of via layout patterns 426.

In operation 912 of method 900, a set of cut feature layout patterns is generated or placed on the layout design. In some embodiments, the set of cut feature layout patterns of method 900 includes at least portions of one or more layout patterns of the set of cut feature layout patterns 440 or 442.

Figure 10:
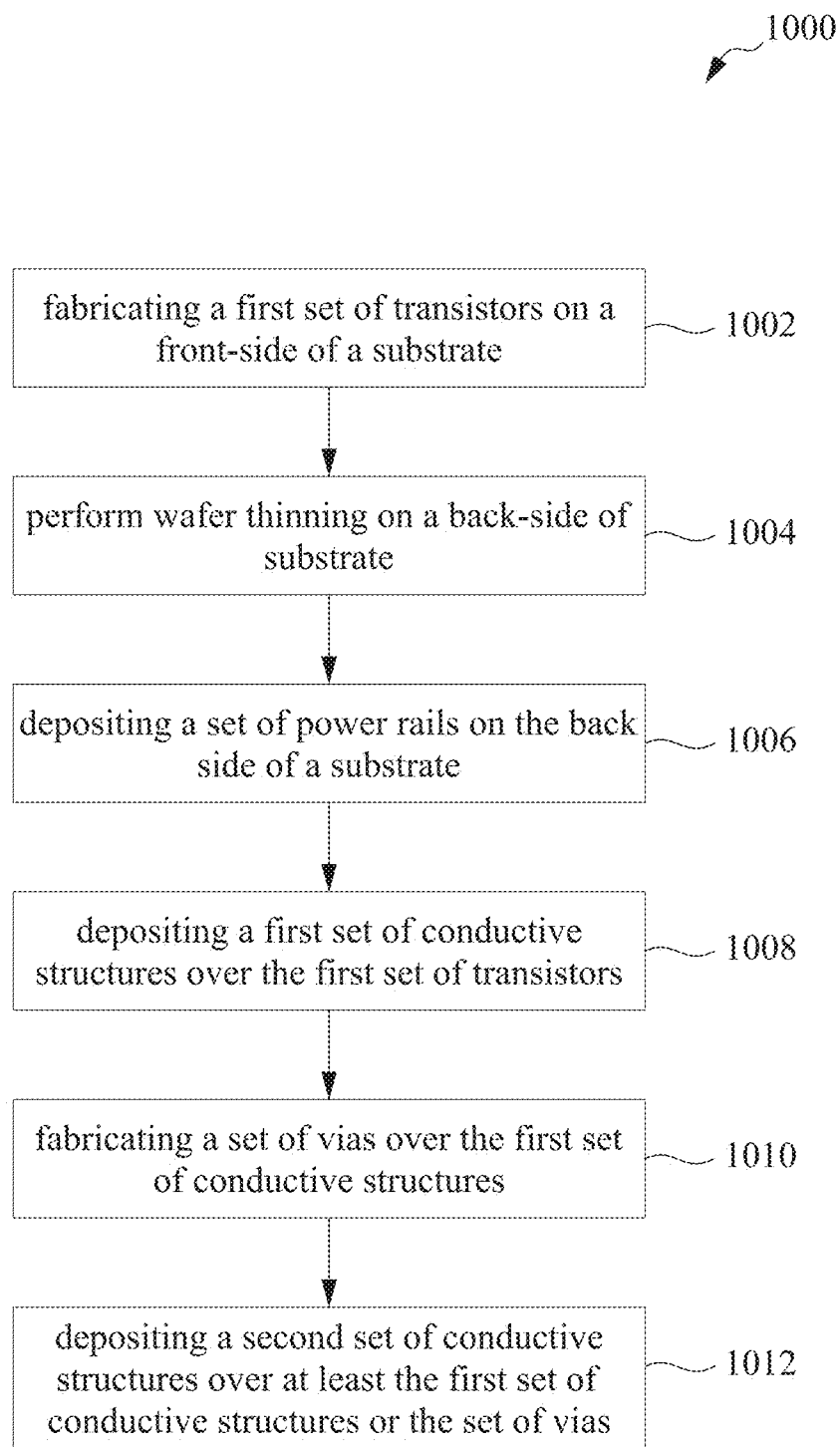
FIG. 10 is a functional flow chart of a method of manufacturing an IC device, in accordance with some embodiments.

FIG. 10 is a functional flow chart of a method of manufacturing an IC device, in accordance with some embodiments. It is understood that additional operations may be performed before, during, and/or after the method 1000 depicted in FIG. 10, and that some other processes may only be briefly described herein. Other order of operations for method 1000 are within the scope of the present disclosure.

In some embodiments, method 1000 is an embodiment of operation 804 of method 800. In some embodiments, the method 1000 is usable to manufacture or fabricate at least integrated circuit 100, 200, 300A-300B, 400A-400B, 500, 600B or 700B or an integrated circuit with similar features as at least layout design 400, 600A or 700A.

In operation 1002 of method 1000, a first set of transistors is fabricated in a substrate or semiconductor wafer. In some embodiments, the first set of transistors of method 1000 includes one or more of NMOS transistors N1, N2, N3, N4, N5, N6, N7, N8, N9, N10, N11, N12, N13, N14, N15 or N16, or one or more of PMOS transistors P1, P2, P3, P4, P5, P6, P7, P8, P9, P10, P11, P12, P13, P14, P15 or P16.

In some embodiments, operation 1002 includes fabricating source and drain regions of the first set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm3 to $1\times10^{14}$ atoms/cm3.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1002 further includes forming a gate region of the first set of transistors. In some embodiments, the gate region is between the drain region and the source region. In some embodiments, the gate region is over the first well and the substrate. In some embodiments, fabricating the gate regions of operation 1002 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1004 of method 1000, wafer thinning is performed on the back-side of the substrate. In some embodiments, operation 1004 includes a thinning process is performed on the back-side of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside of the semiconductor wafer or substrate.

In operation 1006 of method 1000, a set of power rails is deposited on the back-side of the substrate thereby forming the set of power rails. In some embodiments, operation 1006 includes at least depositing a set of conductive regions over the back-side of the integrated circuit thereby forming a set of back-side power rails. In some embodiments, the set of power rails of method 1000 includes at least portions of one or more of the set of set of power rails 504.

In operation 1008 of method 1000, a first set of conductive structures is deposited over the first set of transistors. In some embodiments, the first set of conductive structures of method 1000 includes at least portions of one or more of the set of conductive structures 520, 530, 532, 610', 620', 630', 710', 720' or 730'.

In operation 1010 of method 1000, a set of vias are fabricated. In some embodiments, operation 1010 further includes depositing the set of vias over at least the first set of conductive structures. In some embodiments, the set of vias of method 1000 includes at least portions of one or more of the set of vias 526.

In operation 1012 of method 1000, a second set of conductive structures is deposited over at least the first set of conductive structures or the set of vias. In some embodiments, the second set of conductive structures of method 1000 includes at least portions of one or more of the set of conductive structures 524.

In some embodiments, one or more of operations 1006, 1008, 1010 or 1012 of method 1000 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 12:
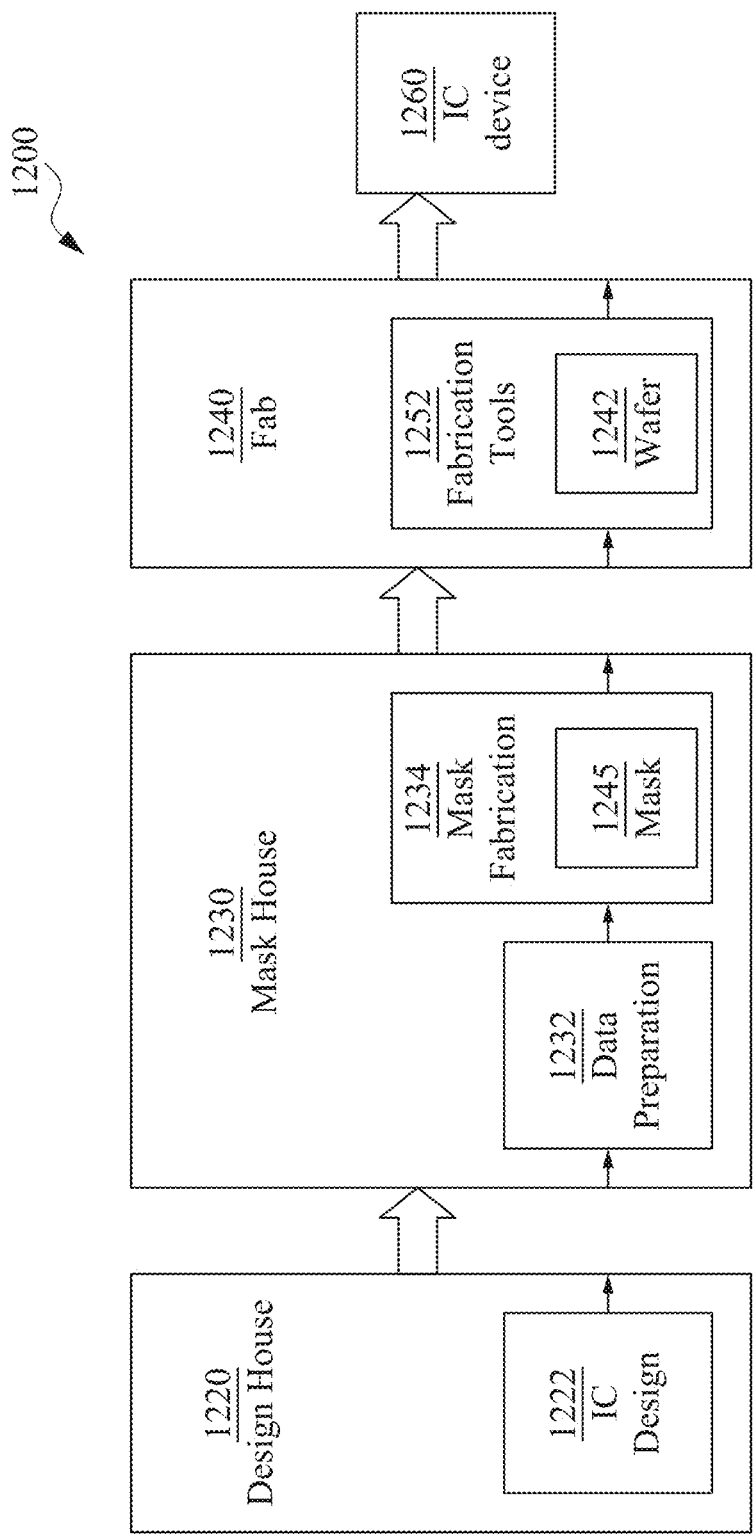
FIG. 12 is a block diagram of an IC manufacturing system, and an IC manufacturing flow associated therewith, in accordance with at least one embodiment of the present disclosure.

In some embodiments, at least one or more operations of method 1000 is performed by system 1200 of FIG. 12. In some embodiments, at least one method(s), such as method 1000 discussed above, is performed in whole or in part by at least one manufacturing system, including system 1200. One or more of the operations of method 1000 is performed by IC fab 1240 (FIG. 12) to fabricate IC device 1260. In some embodiments, one or more of the operations of method 1000 is performed by fabrication tools 1252 to fabricate wafer 1242.

In some embodiments, one or more of the operations of method 800, 900 or 1000 is not performed. One or more of the operations of methods 800-900 is performed by a processing device configured to execute instructions for manufacturing an integrated circuit, such as integrated circuit 100, 200, 300A-300B, 400A-400B, 500, 600B or 700B. In some embodiments, one or more operations of methods 800-900 is performed using a same processing device as that used in a different one or more operations of methods 800-900. In some embodiments, a different processing device is used to perform one or more operations of methods 800-900 from that used to perform a different one or more operations of methods 800-900.

Figure 11:
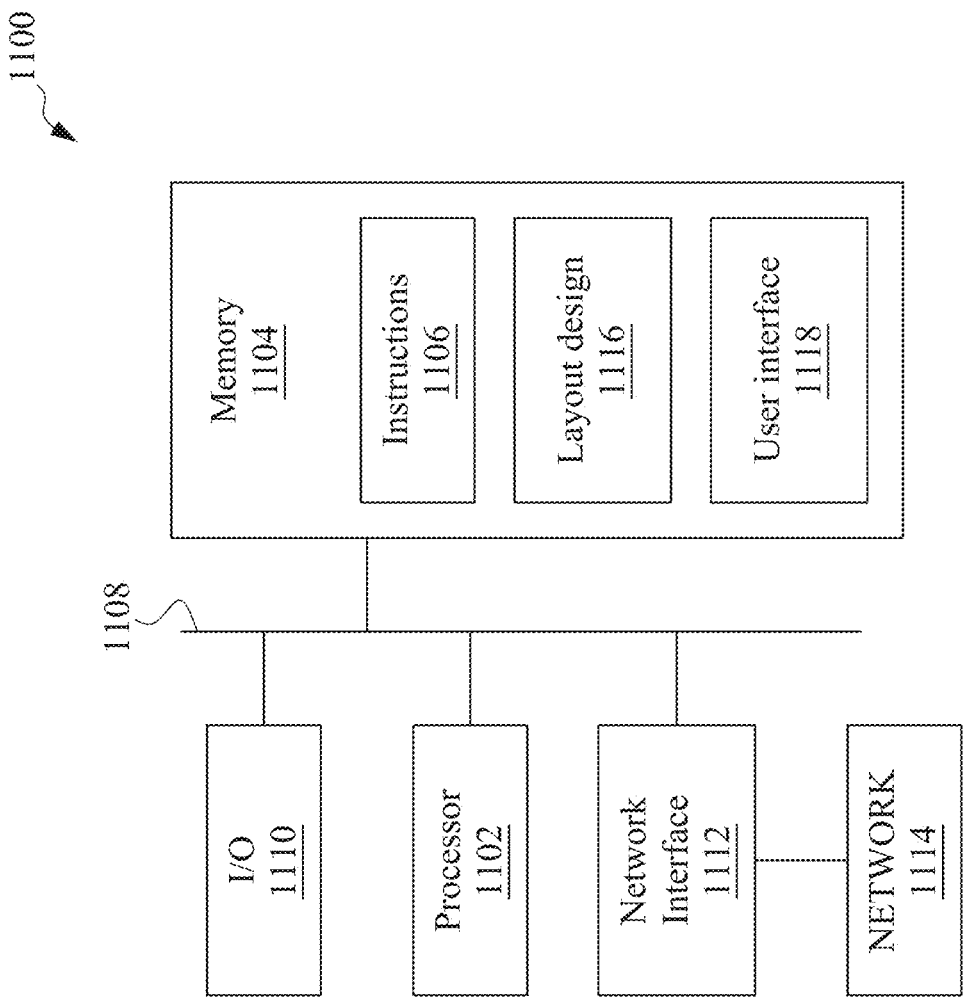
FIG. 11 is a schematic view of a system for designing an IC layout design and manufacturing an IC circuit in accordance with some embodiments.

FIG. 11 is a schematic view of a system 1100 for designing an IC layout design and manufacturing an IC circuit in accordance with some embodiments. In some embodiments, system 1100 generates or places one or more IC layout designs described herein. System 1100 includes a hardware processor 1102 and a non-transitory, computer readable storage medium 1104 (e.g., memory 1104) encoded with, i.e., storing, the computer program code 1106, i.e., a set of executable instructions 1106. Computer readable storage medium 1104 is configured for interfacing with manufacturing machines for producing the integrated circuit. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 900.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 900. In some embodiments, the storage medium 1104 also stores information needed for performing method 900 as well as information generated during performing method 900, such as layout design 1116, user interface 1118 and fabrication unit 1120, and/or a set of executable instructions to perform the operation of method 900. In some embodiments, layout design 1116 comprises one or more of layout patterns of at least layout design 400, 600A or 700A.

In some embodiments, the storage medium 1104 stores instructions (e.g., computer program code 1106) for interfacing with manufacturing machines. The instructions (e.g., computer program code 1106) enable processor 1102 to generate manufacturing instructions readable by the manufacturing machines to effectively implement method 900 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-1194. In some embodiments, method 900 is implemented in two or more systems 1100, and information such as layout design, and user interface are exchanged between different systems 1100 by network 1114.

System 1100 is configured to receive information related to a layout design through I/O interface 1110 or network interface 1112. The information is transferred to processor 1102 by bus 1108 to determine a layout design for producing integrated circuit 100, 200, 300A-300B, 400A-400B, 500, 600B or 700B. The layout design is then stored in computer readable medium 1104 as layout design 1116. System 1100 is configured to receive information related to a user interface through I/O interface 1110 or network interface 1112. The information is stored in computer readable medium 1104 as user interface 1118. System 1100 is configured to receive information related to a fabrication unit through I/O interface 1110 or network interface 1112. The information is stored in computer readable medium 1104 as fabrication unit 1120. In some embodiments, the fabrication unit 1120 includes fabrication information utilized by system 1100. In some embodiments, the fabrication unit 1120 corresponds to mask fabrication 1234 of FIG. 12.

In some embodiments, method 900 is implemented as a standalone software application for execution by a processor. In some embodiments, method 900 is implemented as a software application that is a part of an additional software application. In some embodiments, method 900 is implemented as a plug-in to a software application. In some embodiments, method 900 is implemented as a software application that is a portion of an EDA tool. In some embodiments, method 900 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 900 is implemented by a manufacturing device to manufacture an integrated circuit using a set of masks manufactured based on one or more layout designs generated by system 1100. In some embodiments, system 1100 is a manufacturing device configured to manufacture an integrated circuit using a set of masks manufactured based on one or more layout designs of the present disclosure. In some embodiments, system 1100 of FIG. 11 generates layout designs of an integrated circuit that are smaller than other approaches. In some embodiments, system 1100 of FIG. 11 generates layout designs of integrated circuit structure that occupy less area and provide better routing resources than other approaches.

FIG. 12 is a block diagram of an integrated circuit (IC) manufacturing system 1200, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 (hereinafter "system 1200") includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1220, mask house 1230, and IC fab 1240 is owned by a single larger company. In some embodiments, one or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes data preparation 1232 and mask fabrication 1234. Mask house 1230 uses IC design layout 1222 to manufacture one or more masks 1245 to be used for fabricating the various layers of IC device 1260 according to IC design layout 1222. Mask house 1230 performs mask data preparation 1232, where IC design layout 1222 is translated into a representative data file ("RDF"). Mask data preparation 1232 provides the RDF to mask fabrication 1234. Mask fabrication 1234 includes a mask writer. A mask writer converts the RDF to an image on a substrate, such as a mask (reticle) 1245 or a semiconductor wafer 1242. The design layout 1222 is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, data preparation 1232 includes additional features such as a logic operation (LOP) to modify the IC design layout according to manufacturing rules. Additionally, the processes applied to IC design layout 1222 during data preparation 1232 may be executed in a variety of different orders.

After mask data preparation 1232 and during mask fabrication 1234, a mask 1245 or a group of masks 1245 are fabricated based on the modified IC design layout 1222. In some embodiments, mask fabrication 1234 includes performing one or more lithographic exposures based on IC design layout 1222. In some embodiments, an electron-beam (e-beam) or a mechanism of multiple e-beams is used to form a pattern on a mask (photomask or reticle) 1245 based on the modified IC design layout 1222. The mask 1245 can be formed in various technologies. In some embodiments, the mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1245 includes a transparent substrate (e.g., fused quartz) and an opaque material (e.g., chromium) coated in the opaque regions of the binary mask. In another example, the mask 1245 is formed using a phase shift technology. In the phase shift mask (PSM) version of mask 1245, various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication entity that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1240 includes wafer fabrication tools 1252 (hereinafter "fabrication tools 1252") configured to execute various manufacturing operations on semiconductor wafer 1242 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1240 uses mask(s) 1245 fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using mask(s) 1245 to form IC device 1260. In some embodiments, the IC fabrication includes performing one or more lithographic exposures based at least indirectly on IC design layout 1222. Semiconductor wafer 1242 includes a silicon substrate or other proper substrate having material layers formed thereon. Semiconductor wafer 1242 further includes one or more of various doped regions, dielectric features, multilevel interconnects, and the like (formed at subsequent manufacturing steps).

System 1200 is shown as having design house 1220, mask house 1230 or IC fab 1240 as separate components or entities. However, it is understood that one or more of design house 1220, mask house 1230 or IC fab 1240 are part of the same component or entity.

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an IC. In some embodiments, the IC includes a set of power rails on a back-side of a substrate, and extending in a first direction. In some embodiments, each power rail is separated from an adjacent power rail in a second direction different from the first direction. In some embodiments, the IC further includes a first flip-flop including a first set of conductive structures extending in the first direction, and being located on a first metal layer. In some embodiments, the IC further includes a second flip-flop abutting the first flip-flop at a first boundary. In some embodiments, the second flip-flop includes a second set of conductive structures extending in the first direction, being located on the first metal layer, the second set of conductive structures being separated from the first set of conductive structures in the second direction. In some embodiments, the IC further includes a third flip-flop abutting the second flip-flop at a second boundary. In some embodiments, the third flip-flop includes a third set of conductive structures extending in the first direction, being located on the first metal layer and being separated from the first and second set of conductive structures in the second direction. In some embodiments, the first flip-flop, the second flip-flop and the third flip-flop are on a front-side of the substrate opposite from the back-side. In some embodiments, the second set of conductive structures are offset from the first boundary and the second boundary in the second direction.

Another aspect of this description relates to an IC. In some embodiments, the IC includes a set of power rails on a back-side of a substrate, and extending in a first direction. In some embodiments, each power rail is separated from an adjacent power rail in a second direction different from the first direction. In some embodiments, the IC further includes a first flip-flop including a first region. In some embodiments, the first region includes a first set of conductive structures extending in the first direction, being located on a first level. In some embodiments, the IC further includes a second flip-flop including a second region, the second region abutting the first region at a first boundary. In some embodiments, the second flip-flop includes a second set of conductive structures extending in the first direction, being located on the first level. In some embodiments, the second set of conductive structures is separated from the first set of conductive structures in the second direction. In some embodiments, the IC further includes a third flip-flop including a third region, the third region abutting the second region at a second boundary. In some embodiments, the third flip-flop includes a third set of conductive structures extending in the first direction, being located on the first level and being separated from the first and second set of conductive structures in the second direction. In some embodiments, the first flip-flop, the second flip-flop and the third flip-flop are on a front-side of the substrate opposite from the back-side. In some embodiments, the first set of conductive structures and the second set of conductive structures are offset from the first boundary in the second direction.

Still another aspect of this description relates to a method of fabricating an IC. In some embodiments, the method includes depositing a set of power rails on a back-side of a substrate, the set of power rails extending in a first direction, each power rail being separated from an adjacent power rail in a second direction different from the first direction. In some embodiments, the method further includes forming a first flip-flop including a first set of transistors in a first region. In some embodiments, the forming the first flip-flop includes depositing a first set of conductive structures over the first set of transistors, the first set of conductive structures extending in the first direction, being located on a first level. In some embodiments, the method further includes forming a second flip-flop including a second set of transistors in a second region, the second region abutting the first region at a first boundary. In some embodiments, the forming the second flip-flop includes depositing a second set of conductive structures over the second set of transistors, the second set of conductive structures extending in the first direction, being located on the first level, and being separated from the first set of conductive structures in the second direction. In some embodiments, the method further includes forming a third flip-flop including a third set of transistors in a third region, the third region abutting the second region at a second boundary. In some embodiments, the forming the third flip-flop includes depositing a third set of conductive structures over the third set of transistors, the third set of conductive structures extending in the first direction, being located on the first level and being separated from the first and second set of conductive structures in the second direction. In some embodiments, the first flip-flop, the second flip-flop and the third flip-flop are on a front-side of the substrate opposite from the back-side. In some embodiments, the first set of conductive structures and the second set of conductive structures are offset from the first boundary in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a set of power rails on a back-side of a substrate, and extending in a first direction, each power rail being separated from an adjacent power rail in a second direction different from the first direction;
   a first flip-flop comprising:
     a first set of conductive structures extending in the first direction, and being located on a first metal layer; and
     a first inverter having a first output pin;
   a second flip-flop abutting the first flip-flop at a first boundary, the second flip-flop comprising:
     a second set of conductive structures extending in the first direction, being located on the first metal layer, the second set of conductive structures being separated from the first set of conductive structures in the second direction; and
     a second inverter having a second output pin; and
   a third flip-flop abutting the second flip-flop at a second boundary, the third flip-flop comprising:
     a third set of conductive structures extending in the first direction, being located on the first metal layer and being separated from the first set of conductive structures and the second set of conductive structures in the second direction; and
     a third inverter having a third output pin; and
   a first conductive structure on a second metal layer above the first metal layer, extending in the second direction, overlapping the first boundary and the second boundary, and electrically coupling the first output pin, the second output pin and the third output pin together, each of the first inverter, the second inverter and the third inverter being configured to output a clock signal on the first conductive structure;
   wherein the first flip-flop, the second flip-flop and the third flip-flop are on a front-side of the substrate opposite from the back-side; and
   wherein the second set of conductive structures are offset from the first boundary and the second boundary in the second direction.

2. The integrated circuit of claim 1, wherein
   the first flip-flop further comprises:
     a fourth inverter having a first input pin, at least a first conductive structure of the first set of conductive structures corresponds to the first input pin of the fourth inverter;
   the second flip-flop further comprises:
     a fifth inverter having a second input pin, at least a second conductive structure of the second set of conductive structures corresponds to the second input pin of the fifth inverter; and
   the third flip-flop further comprises:
     a sixth inverter having a third input pin, at least a third conductive structure of the third set of conductive structures corresponds to the third input pin of the sixth inverter.

3. The integrated circuit of claim 2, further comprising:
   a second conductive structure on the second metal layer above the first metal layer, extending in the second direction, overlapping the first boundary and the second boundary, and electrically coupling the first input pin, the second input pin and the third input pin together, the second conductive structure configured to receive a first clock signal.

4. The integrated circuit of claim 2, wherein
   at least a fourth conductive structure of the first set of conductive structures corresponds to the first output pin;
   at least a fifth conductive structure of the second set of conductive structures corresponds to the second output pin; and
   at least a sixth conductive structure of the third set of conductive structures corresponds to the third output pin.

5. The integrated circuit of claim 4, wherein
   the first inverter is coupled to the fourth inverter,
   the second inverter is coupled to the fifth inverter, and
   the third inverter is coupled to the sixth inverter.

6. The integrated circuit of claim 1, wherein
   the first set of conductive structures are offset from the first boundary in the second direction, and
   the third set of conductive structures are offset from the second boundary in the second direction.

7. The integrated circuit of claim 1, wherein
   the first flip-flop further comprises:
     a fourth set of conductive structures extending in the second direction, overlapping the first set of conductive structures and being located on the second metal layer;
   the second flip-flop further comprises:
     a fifth set of conductive structures extending in the second direction, overlapping the second set of conductive structures and being located on the second metal layer; and
   the third flip-flop further comprises:
     a sixth set of conductive structures extending in the second direction, overlapping the third set of conductive structures and being located on the second metal layer.

8. The integrated circuit of claim 7, wherein
   the first flip-flop further comprises:
     a first set of vias between the first set of conductive structures and the fourth set of conductive structures;
   the second flip-flop further comprises:
     a second set of vias between the second set of conductive structures and the fifth set of conductive structures; and
   the third flip-flop further comprises:
     a third set of vias between the third set of conductive structures and the sixth set of conductive structures.

9. An integrated circuit comprising:
   a first power rail on a back-side of a substrate, and extending in a first direction;
   a first flip-flop coupled to at least the first power rail, and including a first region, the first region comprising:
     a first inverter coupled to the first power rail;

a second inverter having a first output pin; and
a first input pin coupled to the first inverter;
a second flip-flop coupled to at least the first power rail, and including a second region, the second region abutting the first region at a first boundary and comprising:
a third inverter coupled to the first power rail;
a fourth inverter having a second output pin; and
a second input pin coupled to the third inverter; and
a first conductive structure on a first metal layer, extending in a second direction different from the first direction, overlapping the first boundary, and electrically coupling the first output pin and the second output pin together, each of the second inverter and the fourth inverter being configured to output a clock signal on the first conductive structure;
wherein the first flip-flop and the second flip-flop are on a front-side of the substrate opposite from the backside; and
wherein the first input pin and the second input pin are offset from the first boundary in the second direction.

10. The integrated circuit of claim 9, wherein the first inverter comprises:
a first transistor having a first gate, the first gate extending in the second direction;
a second transistor having a second gate, the second gate extending in the second direction and being coupled to the first gate; and
a first via between the first input pin and the first gate or the second gate;
wherein the first input pin is electrically coupled to the first gate or the second gate by the first via.

11. The integrated circuit of claim 10, wherein the third inverter comprises:
a third transistor having a third gate, the third gate extending in the second direction;
a fourth transistor having a fourth gate, the fourth gate extending in the second direction and being coupled to the third gate; and
a second via between the second input pin and the third gate or the fourth gate;
wherein the second input pin is electrically coupled to the third gate or the fourth gate by the second via.

12. The integrated circuit of claim 9, further comprising:
a set of active regions in the substrate, extending in the first direction, and being above the first power rail, each active region being separated from an adjacent active region in the set of active regions in the second direction.

13. The integrated circuit of claim 12, further comprising:
a first via between the set of active regions and the first power rail, the first via electrically coupling the first power rail and the set of active regions together.

14. The integrated circuit of claim 13, wherein
the first region further comprises:
a second conductive structure extending in the second direction and being located on a first level;
the first inverter including a first transistor, the first transistor including a first drain region; and
the third inverter including a second transistor, the second transistor including a second drain region; and
the second conductive structure electrically coupling the first drain region and the second drain region together.

15. The integrated circuit of claim 14, wherein
the first region further comprises:
a first set of conductive structures extending in the first direction, overlapping the second conductive structure, and being located on a second level different from the first level; and
the second region further comprises:
a second set of conductive structures extending in the first direction, being located on the second level, and being separated from the first set of conductive structures in the second direction;
wherein the first set of conductive structures and the second set of conductive structures are offset from the first boundary in the second direction.

16. The integrated circuit of claim 15, wherein
the first region further comprises:
a third set of conductive structures extending in the second direction, overlapping the first set of conductive structures and being located on a third level different from the first level and the second level; and
the second region further comprises:
a fourth set of conductive structures extending in the second direction, overlapping the second set of conductive structures and being located on the third level.

17. The integrated circuit of claim 16, wherein
the first region further comprises:
a first set of vias between the first set of conductive structures and the third set of conductive structures; and
the second region further comprises:
a second set of vias between the second set of conductive structures and the fourth set of conductive structures.

18. The integrated circuit of claim 15, wherein
the first input pin has a first width in the second direction;
the second input pin has the first width in the second direction;
at least a first conductive structure of the first set of conductive structures has a second width in the second direction different from the first width; and
at least a first conductive structure of the second set of conductive structures has a third width in the second direction different from the first width.

19. An integrated circuit comprising:
a first power rail on a back-side of a substrate, extending in a first direction, and being configured to supply a first voltage;
a second power rail on the back-side of the substrate, extending in the first direction, and being separated from the first power rail in a second direction different from the first direction, the second power rail being configured to supply a second voltage different from the first voltage;
a first flip-flop coupled to at least the first power rail and the second power rail, and including a first region, the first region comprising:
a first inverter coupled to the first power rail and the second power rail; and
a first output pin coupled to the first inverter, and being located on a first metal layer;
a second flip-flop coupled to at least the first power rail and the second power rail, and including a second region, the second region abutting the first region at a first boundary and comprising:
a second inverter coupled to the first power rail and the second power rail; and a second output pin coupled to the second inverter, and being located on the first metal layer; and a first conductive structure on a second metal layer above the first metal layer, extending in the second direction, overlapping the first boundary, and electrically coupling the first output pin and the second output pin together, each of the first inverter and the second inverter being configured to output a clock signal on the first conductive structure;

wherein the first flip-flop and the second flip-flop are on a front-side of the substrate opposite from the back-side; and wherein the first output pin and the second output pin are offset from the first boundary in the second direction.

20. The integrated circuit of claim 19, further comprising:

a set of active regions in the substrate, extending in the first direction, and being located on a first level, and above the first power rail and the second power rail, each active region being separated from an adjacent active region in the set of active regions in the second direction.

* * * * *